United States Patent
Yoshikawa et al.

(10) Patent No.: US 8,089,134 B2
(45) Date of Patent: Jan. 3, 2012

(54) SEMICONDUCTOR DEVICE

(75) Inventors: Koh Yoshikawa, Matsumoto (JP);
Tomoyuki Yamazaki, Matsumoto (JP);
Yuichi Onozawa, Matsumoto (JP)

(73) Assignee: Fuji Electric Sytems Co., Ltd., Tokyo (JP)

( * ) Notice: Subject to any disclaimer, the term of this patent is extended or adjusted under 35 U.S.C. 154(b) by 143 days.

(21) Appl. No.: 12/320,666

(22) Filed: Jan. 30, 2009

(65) Prior Publication Data
US 2009/0230500 A1    Sep. 17, 2009

(30) Foreign Application Priority Data

Feb. 6, 2008  (JP) .................. 2008-026412
Feb. 8, 2008  (JP) .................. 2008-029256

(51) Int. Cl.
*H01L 31/058* (2006.01)
(52) U.S. Cl. ......... 257/470; 257/467; 257/468; 257/469
(58) Field of Classification Search .................. 257/467, 257/468, 469, 470
See application file for complete search history.

(56) References Cited

U.S. PATENT DOCUMENTS
4,903,106 A    2/1990  Fukunaga et al.

FOREIGN PATENT DOCUMENTS

| JP | 01-157573 | 6/1989 |
|---|---|---|
| JP | A-06-117942 | 4/1994 |
| JP | 10-041510 | 2/1998 |
| JP | 10-41510 | * 2/1998 |
| JP | 2001-102575 | * 4/2001 |
| JP | A-2005-286270 | 10/2005 |
| JP | 2006-324412 | * 11/2006 |
| JP | A-2006-302977 | 11/2006 |
| JP | A-2006-324412 | 11/2006 |

* cited by examiner

*Primary Examiner* — Tan N Tran
(74) *Attorney, Agent, or Firm* — Rabin & Berdo, P.C.

(57) ABSTRACT

A semiconductor device equipped with a primary semiconductor element and a temperature detecting element for detecting a temperature of the primary semiconductor element. The device includes a first semiconductor layer of a first conductivity type that forms the primary semiconductor element. A second semiconductor region of a second conductivity type is provided in the first semiconductor layer. A third semiconductor region of the first conductivity type is provided in the second semiconductor region. The temperature detecting element is provided in the third semiconductor region and is separated from the first semiconductor layer by a PN junction.

20 Claims, 20 Drawing Sheets

SEMICONDUCTOR DEVICE

BACKGROUND OF THE INVENTION

1. Field of the Invention

The present invention relates to a semiconductor device equipped with a primary semiconductor element and a temperature detecting element.

2. Description of the Related Art

It is desirable that a semiconductor device used for power switching is provided with an overheat protection function to prevent thermal breakdown of the semiconductor device due to an over-current. A function using change of forward and reverse characteristics of a diode in accordance with temperature is commonly known as the overheat protection function. For example, the forward voltage and the saturation voltage of a diode vary substantially linearly in accordance with temperature. Therefore, when a semiconductor device and a diode are provided as a main element (hereinafter referred to as primary semiconductor element) and a temperature detecting element respectively, the temperature of the primary semiconductor element can be detected by monitoring the forward voltage or the saturation voltage of the diode (e.g. as disclosed in U.S. Pat. No. 4,903,106, Japanese patent documents JP-A-2006-324412 and JP-A-2006-302977, and Japanese patent number 3,538,505). By reducing the gate voltage of the primary semiconductor element to limit the current flowing in the primary semiconductor element in response to the detection of the high temperature state of the primary semiconductor element, the primary semiconductor element can be protected from breakdown due to overheating.

FIG. 1 is a sectional view showing the configuration of a semiconductor device according to the related art. As shown in FIG. 1, the semiconductor device according to the related art has an N$^-$ drift layer 3, a surface structure of a primary semiconductor element 1, and a temperature detecting diode 2. The surface structure of the primary semiconductor element 1 and the temperature detecting diode 2 are provided in a first principal surface of the N$^-$ drift layer 3. The surface structure of the primary semiconductor element 1 has a P-base region 4a, an N$^+$ emitter (source) region 5, a gate insulating film 6, a gate electrode 7, and an emitter (source) electrode 8. The temperature detecting element 2 has a P-type anode region (a P-base region 4b and a P$^+$ region 9), an N$^+$ cathode region 10, an anode electrode (not shown), and a cathode electrode (not shown).

Alternatively, a semiconductor device having a primary semiconductor element 1, an insulating film 11 formed in a first principal surface of a constituent semiconductor member of the primary semiconductor element 1, and a temperature detecting diode 2 formed on the insulating film 11 is commonly known as represented by a semiconductor device shown in FIG. 2 (e.g. as shown in Japanese patent document JP-A-6-117942). In addition, a power module in which a thermistor for detecting heat emitted from a switching circuit and a rectifier circuit is disposed nearby the switching circuit and the rectifier circuit is commonly known (e.g. as shown in Japanese patent document JP-A-2005-286270). In this specification and accompanying drawings, a layer or a region prefixed with N or P means that electrons or holes are majority carriers therein, respectively. Moreover, a layer or region with a superscript "+" or "−" attached to N or P indicates that the impurity concentration of the layer or region is higher or lower, respectively, than that of a layer or region without any superscript "+" or "−" attached to N or P.

In the semiconductor device shown in FIG. 1, a parasitic diode is however formed from the anode region of the temperature detecting diode and the N$^-$ drift layer. When a channel is formed in the primary semiconductor element, a current flowing in the channel also flows in the parasitic diode. For this reason, there is a problem that the forward voltage or the saturation voltage of the temperature detecting diode varies according to whether the primary semiconductor element is in an ON state or in an OFF state. In addition, when the primary semiconductor element is an IGBT (Insulated Gate Bipolar Transistor), a parasitic thyristor is formed from a P collector layer in a second principal surface, the N$^-$ drift layer and the P-type anode region and N$^+$ cathode region of the temperature detecting diode. When this IGBT is turned OFF, there is a risk that latch-up breakdown will be caused by malfunction of the parasitic thyristor because holes which are minority carriers are imported from the N$^-$ drift layer into the anode region.

A configuration in which the primary semiconductor element and the temperature detecting diode are electrically insulated and separated has been disclosed in the aforementioned Japanese patent number 3,538,505. In this configuration, a parasitic thyristor is however formed from the primary semiconductor element and the temperature detecting diode. For this reason, there is a problem that the parasitic thyristor causes latch-up breakdown in the case where voltage change (dV/dt) at the time of switching is large and in the case where the current quantity is large.

In the semiconductor device shown in FIG. 2, the forward voltage (or the saturation voltage) of the temperature detecting diode varies because the temperature detecting diode is formed from polycrystalline silicon (polysilicon). In addition, the dependence of the ON-voltage on temperature deviates from a theoretical curve because the leakage current is very large. There is a problem that accuracy in detection of the temperature of the primary semiconductor element is low for these reasons. In addition, there are a problem that the electrostatic tolerance of the temperature detecting diode is low and a problem that the response speed of the primary semiconductor element to temperature change is slow, because the temperature detecting diode formed on the insulating film is small in size. In addition, there is a problem that the number of production steps increases remarkably. Particularly when the primary semiconductor element is a trench gate type element, it is impossible to form the temperature detecting diode from doped polysilicon though the doped polysilicon is generally used for the gate electrode. That is, there is a problem that the number of production steps further increases because it is necessary to form the temperature detecting diode by laminating polysilicon separately from the gate electrode.

SUMMARY OF THE INVENTION

In order to solve the foregoing problems belonging to the related art, an object of the invention is to provide a semiconductor device equipped with a temperature detecting element having constant temperature characteristic regardless of the state of a primary semiconductor element.

Another object of the invention is to provide a semiconductor device high in latch-up tolerance.

A further object of the invention is to provide a semiconductor device high in temperature detection accuracy.

In order to solve the foregoing problems and achieve the objects, the semiconductor device according to the invention is equipped with a primary semiconductor element and a temperature detecting element for detecting a temperature of the primary semiconductor element. The semiconductor device includes a first semiconductor layer of a first conductivity type which forms the primary semiconductor element, a second semiconductor region of a second conductivity type provided in the first semiconductor layer, and a third semiconductor region of the first conductivity type provided in the second semiconductor region, where the temperature detecting element is provided in the third semiconductor region and is separated from the first semiconductor layer by a PN junction.

The semiconductor device may further include a fourth semiconductor region of the second conductivity type provided in the third semiconductor region, where the temperature detecting element is formed as a diode which uses the third semiconductor region as one of a cathode and an anode, and the fourth semiconductor region as the other of the cathode and the anode.

Alternatively, the semiconductor may further include a fourth semiconductor region of the second conductivity type provided in the third semiconductor region, and a fifth semiconductor region of the first conductivity type provided in the fourth semiconductor region, where the third semiconductor region and the fourth semiconductor region are electrically connected, and the temperature detecting element is formed as a diode which uses the fourth semiconductor region as one of an anode and a cathode, and the fifth semiconductor region as the other of the anode and the cathode.

DETAILED DESCRIPTION OF THE PREFERRED EMBODIMENTS

Figure 1:
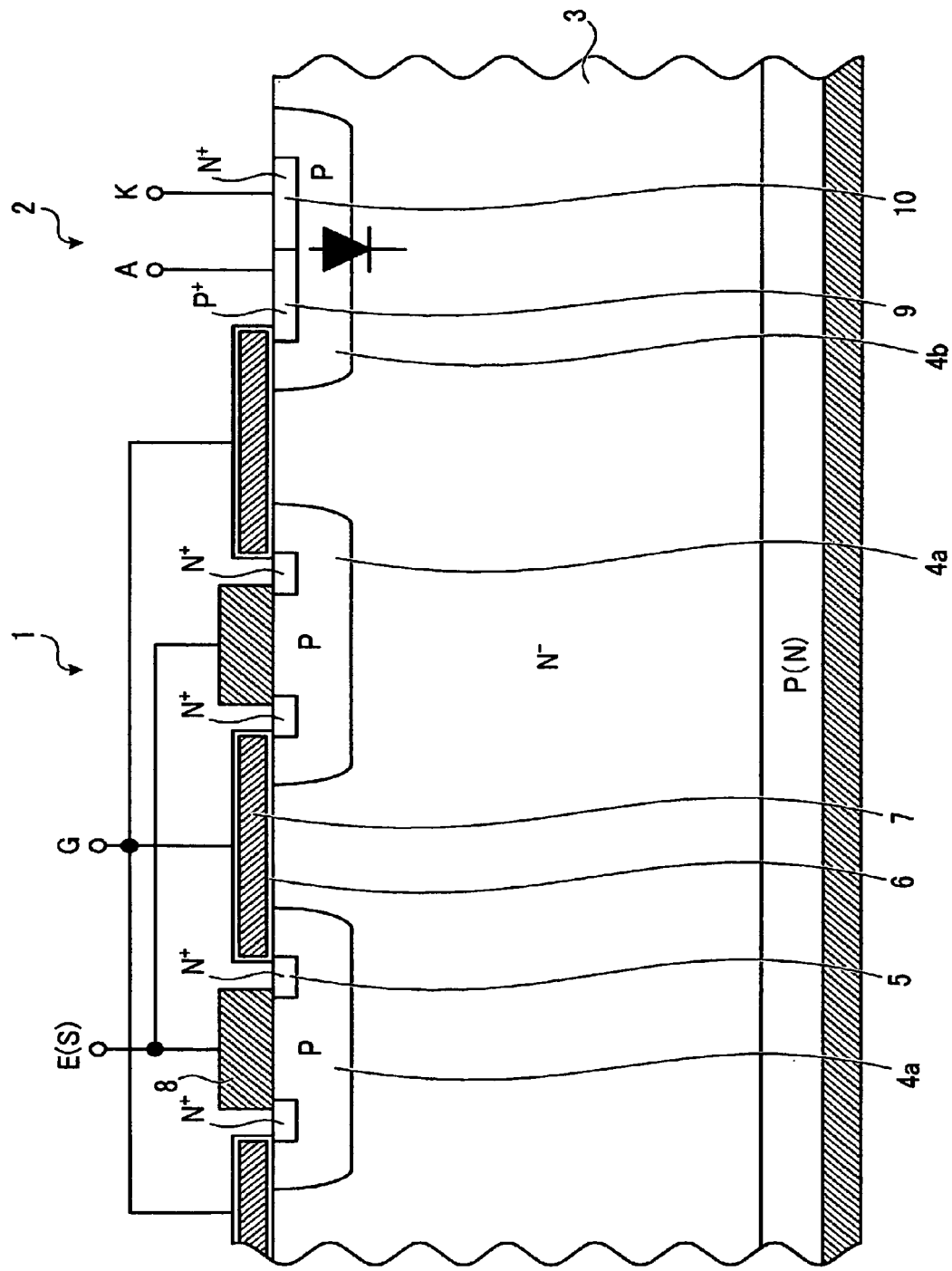
FIG. 1 is a sectional view showing an example of the configuration of a semiconductor device according to the related art.

Preferred embodiments of the invention as to a semiconductor device will be described below in detail with reference to the accompanying drawings. In the following description of the embodiments and the accompanying drawings, the same configurations are marked with the same reference numerals or symbols, unless otherwise stated, and duplicate description will be omitted.

Embodiment 1

Figure 3:
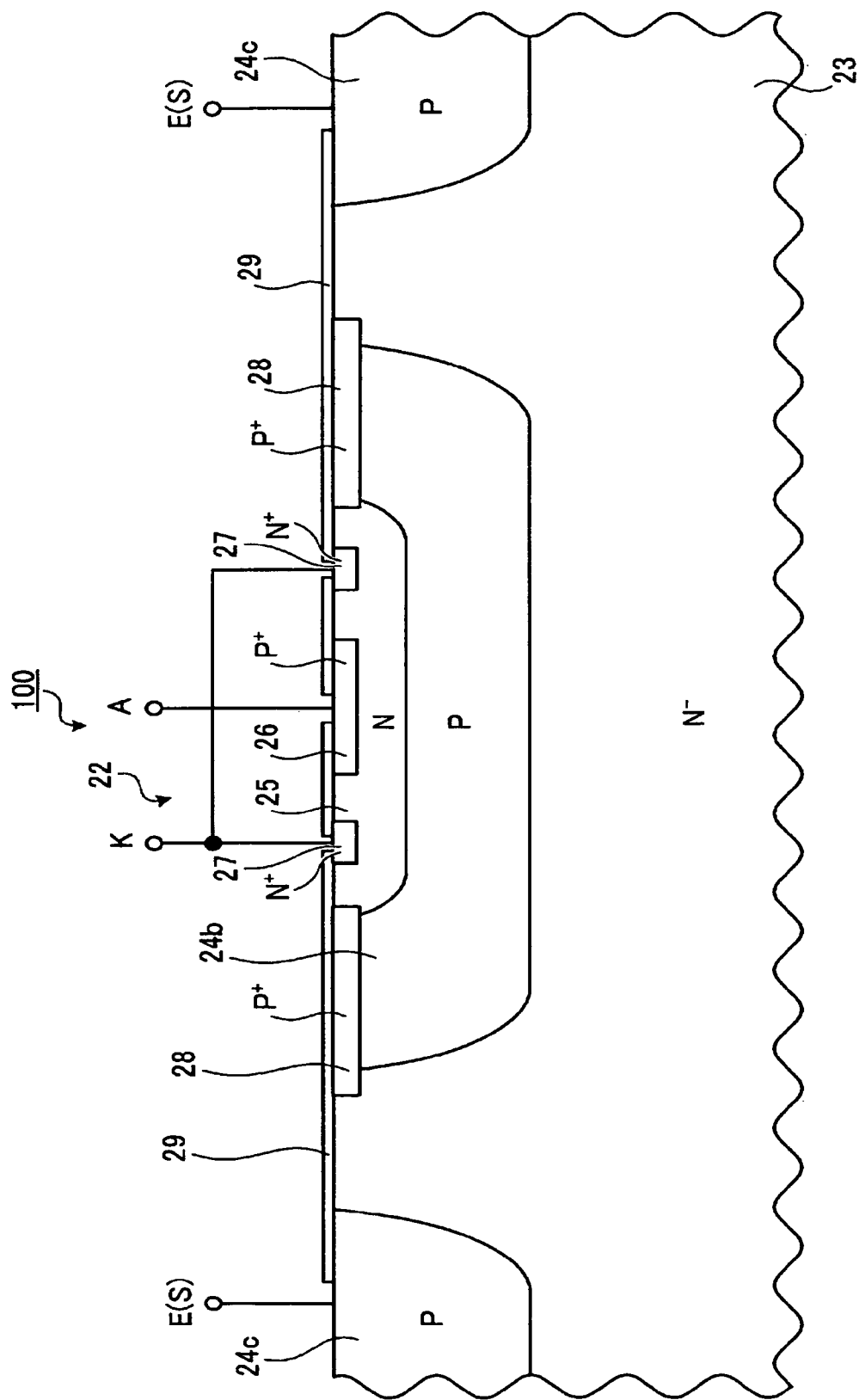
FIG. 3 is a sectional view showing the configuration of a semiconductor device according to Embodiment 1 of the invention.

FIG. 3 is a sectional view showing the configuration of a semiconductor device according to Embodiment 1 of the invention. As shown in FIG. 3, the semiconductor device 100 has a first P well 24b provided as a second semiconductor region in a first principal surface of an $N^-$ drift layer 23 which is a first semiconductor layer. An N well 25 which is a third semiconductor region is provided in the first P well 24b. A temperature detecting diode (temperature detecting element) 22 is provided in the N well 25.

That is, a high-concentration $P^+$ anode region 26 as a fourth semiconductor region and a high-concentration $N^+$ cathode contact region 27 are provided in the N well 25. An anode electrode (A) is connected to the $P^+$ anode region 26. A cathode electrode (K) is connected to the $N^+$ cathode contact region 27. The $N^+$ cathode contact region 27 is provided to bring the cathode electrode into low resistance contact with the N well 25 which serves as a cathode region. The semiconductor device 100 is further equipped with a primary semiconductor element which is not shown but formed from the $N^-$ drift layer 23. The temperature detecting diode 22 is separated from the not-shown primary semiconductor element by a PN junction between the first P well 24b and the N well 25.

The first P well 24b is sufficiently high in concentration to prevent latch-up breakdown due to a parasitic thyristor. In addition, the first P well 24b is sufficiently deep to prevent latch-up breakdown due to the parasitic thyristor. A side of the N well 25 is surrounded by a $P^+$ high-concentration region 28 that is a fifth semiconductor region. The $P^+$ high-concentration region 28 is higher in concentration than the first P well 24b. The $P^+$ high-concentration region 28 is covered with an insulating film 29. The first P well 24b and the P+ high-concentration region 28 are electrically floating.

In the first principal surface of the N− drift layer 23, a second P well 24c is provided outside the first P well 24b so as to be separated from the first P well 24b. For example, the second P well 24c is set to have the same electric potential as that of an emitter (source) of the not-shown primary semiconductor element, so that the second P well 24c forms a diverter for extracting holes. For example, the planar layout of the semiconductor device 100 is not shown but shaped like concentric circles with the P+ anode region 26 as their center.

Figure 2:
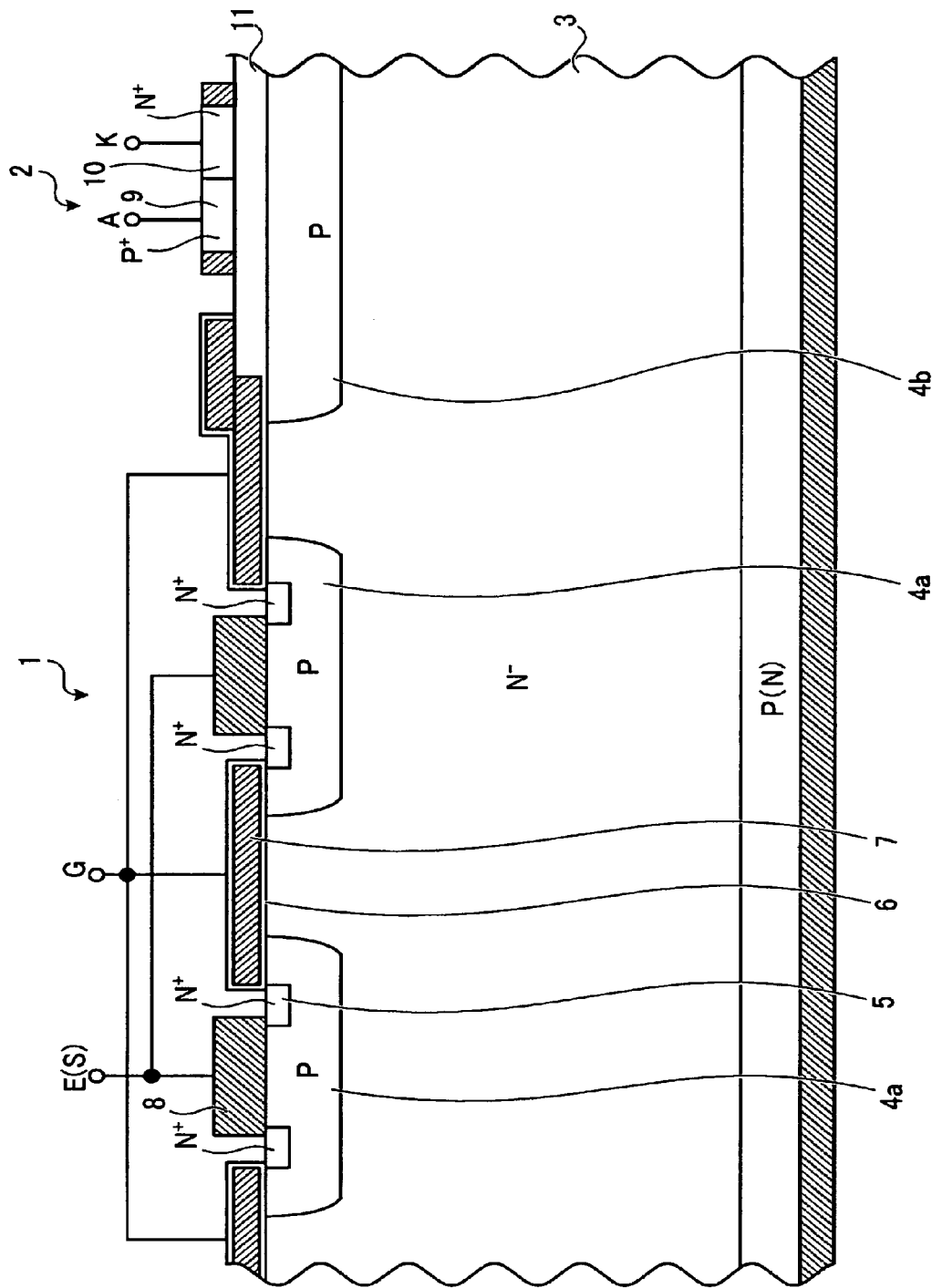
FIG. 2 is a sectional view showing another example of the configuration of the semiconductor device according to the related art.

For production of the semiconductor device 100 shown in FIG. 3, the first P well 24b may be formed at the same time that a guard ring not shown is formed. In addition, the P+ anode region 26 may be formed at the same time that a P+ contact region for bringing an electrode into low resistance contact with a P-type semiconductor region of the primary semiconductor device is formed. In addition, the N+ cathode contact region 27 may be formed at the same time that an N+ contact region or an N+ emitter (source) region for bringing an electrode into low resistance contact with an N-type semiconductor region of the primary semiconductor element is formed. In this manner, the production process of the semiconductor device 100 can be simplified. When these three steps are all used for production of the semiconductor device 100, the production process can be simplified remarkably compared with production of the related-art semiconductor device shown in FIG. 2, because only addition of a process of forming the N well 25 is required.

According to Embodiment 1, even when a channel is formed in the primary semiconductor element and a current flows in the channel, there is no influence on the saturation voltage of the temperature detecting diode 22 because the temperature detecting diode 22 is separated from the primary semiconductor element by a junction. That is, it is possible to produce a temperature detecting diode 22 having a constant saturation voltage regardless of the state of the primary semiconductor element because the saturation voltage of the temperature detecting diode 22 can be prevented from varying according to the state of the primary semiconductor element. In addition, it is possible to produce a semiconductor device 100 equipped with such a temperature detecting diode 22.

Moreover, latch-up breakdown due to a parasitic thyristor can be suppressed because activation of the parasitic thyristor can be suppressed by the first P well 24b. In addition, occurrence of latch-up in a transverse direction can be suppressed because activation of an NPN transistor formed in the transverse direction (a direction crossing the depth direction) can be suppressed by the P+ high concentration region 28. Accordingly, it is possible to produce a semiconductor device 100 high in latch-up tolerance. In addition, it is possible to obtain high temperature detection accuracy because variation in the saturation voltage is low and the leakage current is small compared with the related-art device equipped with the temperature detecting diode formed from polysilicon on the insulating film. In addition, the response speed of the primary semiconductor element to temperature change is high. Incidentally, the P+ anode region 26 and the N+ cathode contact region 27 may be brought into contact with each other. In this manner, variation in the ON-voltage can be reduced.

Embodiment 2

Figure 4:
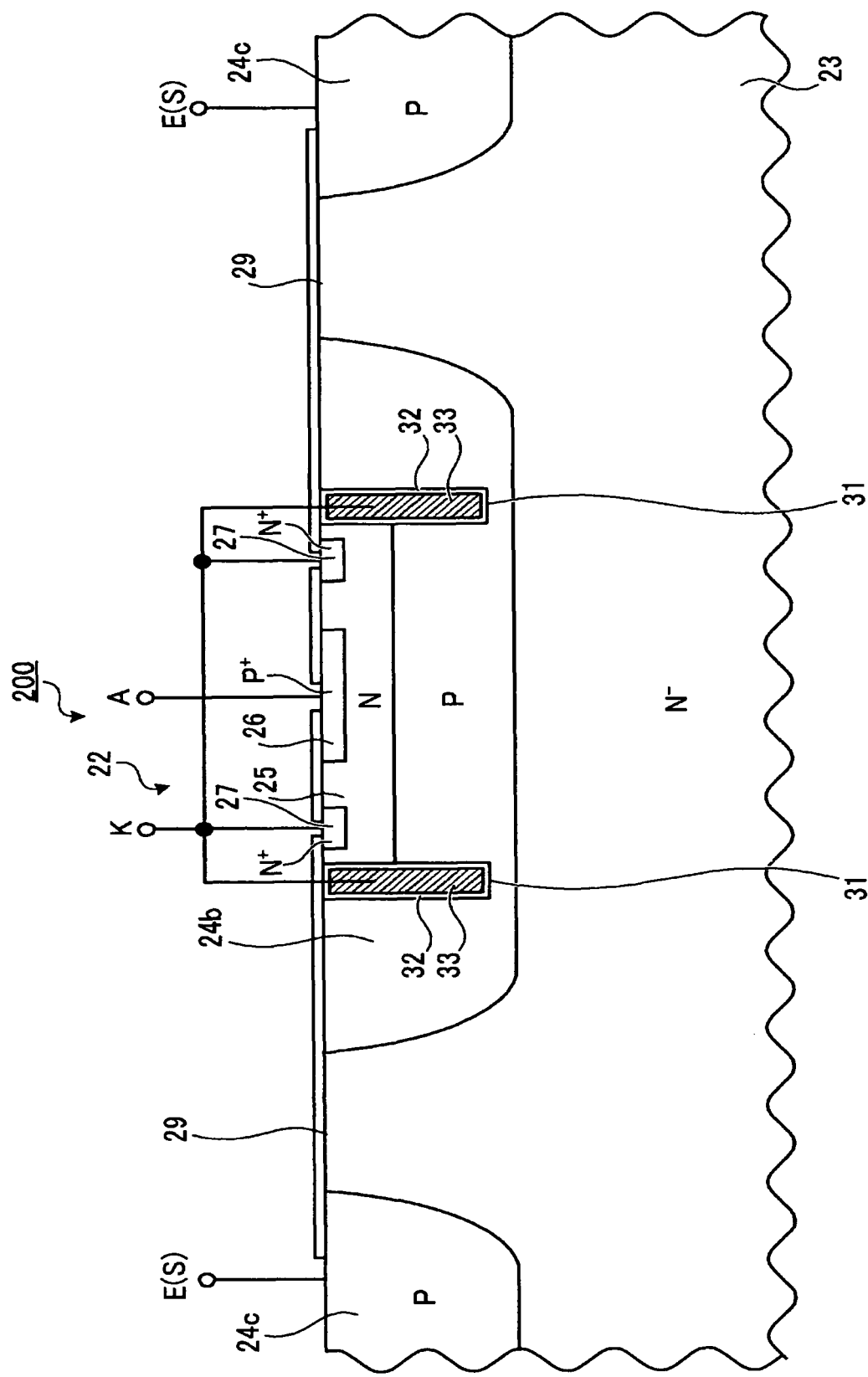
FIG. 4 is a sectional view showing the configuration of a semiconductor device according to Embodiment 2 of the invention.

FIG. 4 is a sectional view showing the configuration of a semiconductor device according to Embodiment 2 of the invention. As shown in FIG. 4, the semiconductor device 200 is configured in the same manner as the semiconductor device 100 according to Embodiment 1 shown in FIG. 3 except that a side of the N well 25 is surrounded by a trench gate structure 31 in place of the P+ high concentration region 28. Occurrence of latch-up in the transverse direction can be prevented because activation of a transverse NPN transistor can be completely prevented by this trench gate structure 31.

The trench gate structure 31 is provided in a terminal portion of the N well 25 in the first P well 24b. The trench gate structure 31 extends to be deeper than the N well 25. An insulating film 32 such as an oxide film is provided in a portion being in contact with a semiconductor of the trench gate structure 31, i.e. in an inner circumferential surface of the trench. The inside of the insulating film 32 is filled with a conductor such as polysilicon 33. It is preferable that this polysilicon 33 is set to have the same electric potential as that of the cathode. When, for example, the gate structure of the primary semiconductor element is a trench gate structure, the trench gate structure 31 may be formed at the same time that the trench gate structure of the primary semiconductor element is formed. The remaining configuration is the same as in Embodiment 1.

Embodiment 3

Figure 5:
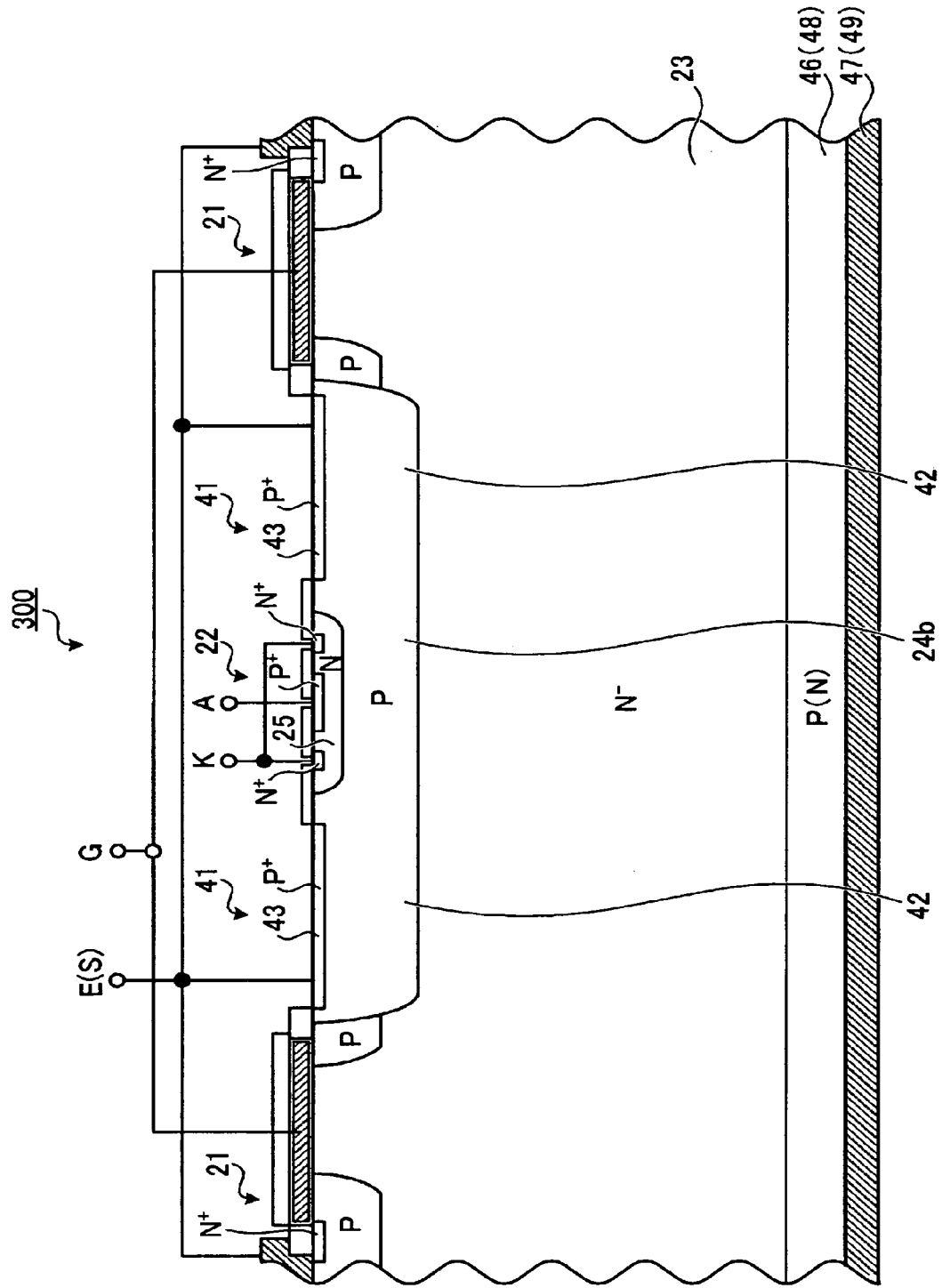
FIG. 5 is a sectional view showing the configuration of a semiconductor device according to Embodiment 3 of the invention.

FIG. 5 is a sectional view showing the configuration of a semiconductor device according to Embodiment 3 of the invention. As shown in FIG. 5, the semiconductor device 300 is a device including the temperature detecting diode 22 configured as shown in FIG. 3 and its peripheral structure. A first P well 24b however further extends in the transverse direction compared with the first P well 24b in Embodiment 1, so that the first P well 24b forms a hole extraction region 42 of a diverter 41. A high-concentration P+ contact region 43 is provided in a front surface of a part of the first P well 24b which forms the diverter 41. The hole extraction region 42 is set to have the same electric potential as the emitter (source) potential of the primary semiconductor element 21. With this configuration, the first P well 24b has the same electric potential as the emitter (source) potential. As a result, occurrence of latchup due to high dV/dt can be suppressed because voltage change (dV/dt) at the time of switching becomes gentle.

Alternatively, the hole extraction region 42 may be formed by another P well provided separately from the first P well 24b. In this case, the P well forming the hole extraction region 42 may be set to have the same electric potential as the emitter (source) potential of the primary semiconductor element 21 and the first P well 24b may be electrically floating in the same manner as in Embodiment 1. Alternatively, the hole extraction region 42 may be formed by the same P-base region as that of the primary semiconductor element 21 and the P-base region may be set to have the same electric potential as the emitter (source) potential.

The primary semiconductor element 21 is not particularly limited. Examples of the primary semiconductor element 21 include a vertical IGBT with a planar gate structure, a vertical MOSFET (Metal Oxide Semiconductor Field Effect Transistor) with a planar gate structure, etc. When the primary semiconductor element 21 is an IGBT, a P collector region 46 and a collector electrode 47 are provided in a second principal surface of the N− drift layer 23. When the primary semiconductor element 21 is an MOSFET, an N drain region 48 and a drain electrode 49 are provided in the second principal surface of the N− drift layer 23. The second principal surface side structure of the N− drift layer 23 is also applied to Embodiments 4 to 6.

Embodiment 4

Figure 6:
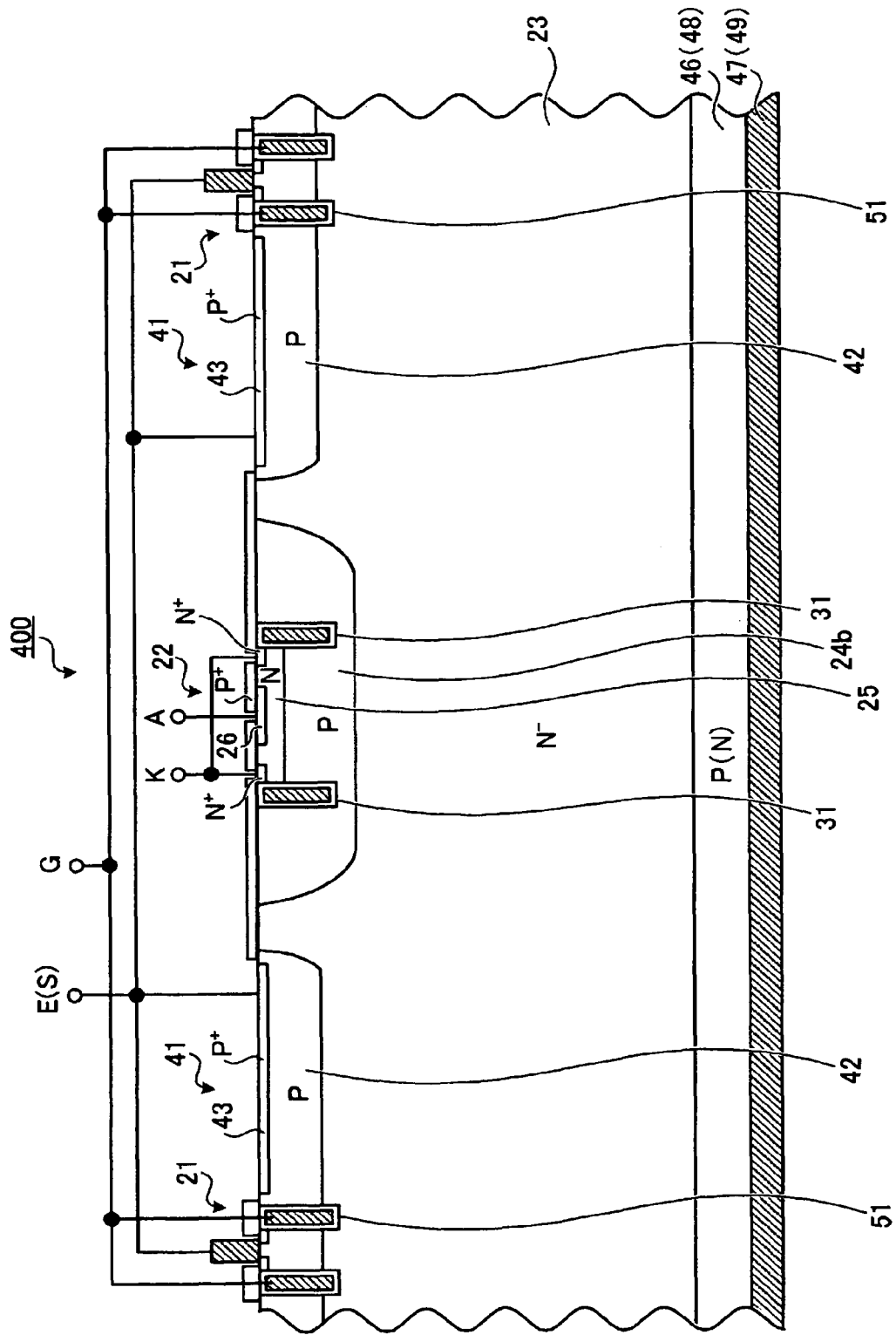
FIG. 6 is a sectional view showing the configuration of a semiconductor device according to Embodiment 4 of the invention.

FIG. 6 is a sectional view showing the configuration of a semiconductor device according to Embodiment 4 of the invention. As shown in FIG. 6, the semiconductor device 400 is a device including the temperature detecting diode 22 configured as shown in FIG. 4 and its peripheral structure. The temperature detecting diode 22 configured as shown in FIG. 4 is suitable for the case where the gate structure of the primary semiconductor element 21 is a trench gate structure 51, because a trench gate structure 31 is provided in a terminal portion of the N well 25. In this case, the trench gate structure 31 of the temperature detecting diode 22 can be formed at the same time that the trench gate structure 51 of the primary semiconductor element 21 is formed.

In addition, the hole extraction region 42 of the diverter 41 is formed by a P-base region. The hole extraction region 42 has a high-concentration P$^+$ contact region 43 in its front surface and is set to have the same electric potential as the emitter (source) potential of the primary semiconductor element 21. Incidentally, the first P well 24b may be electrically floating and may be set to have the same electric potential as the emitter (source) potential of the primary semiconductor element 21.

Embodiment 5

Figure 7:
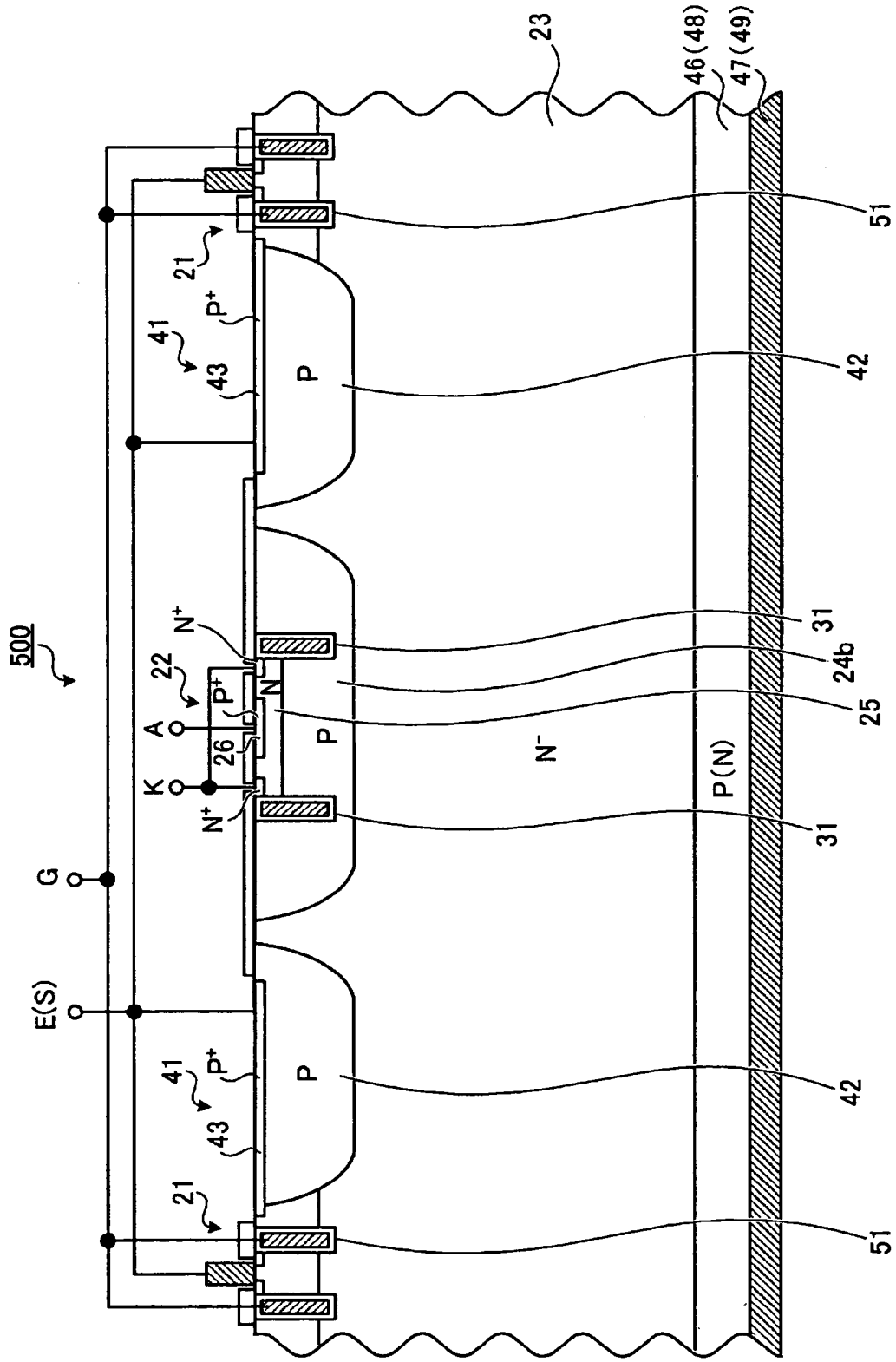
FIG. 7 is a sectional view showing the configuration of a semiconductor device according to Embodiment 5 of the invention.
Figure 8:
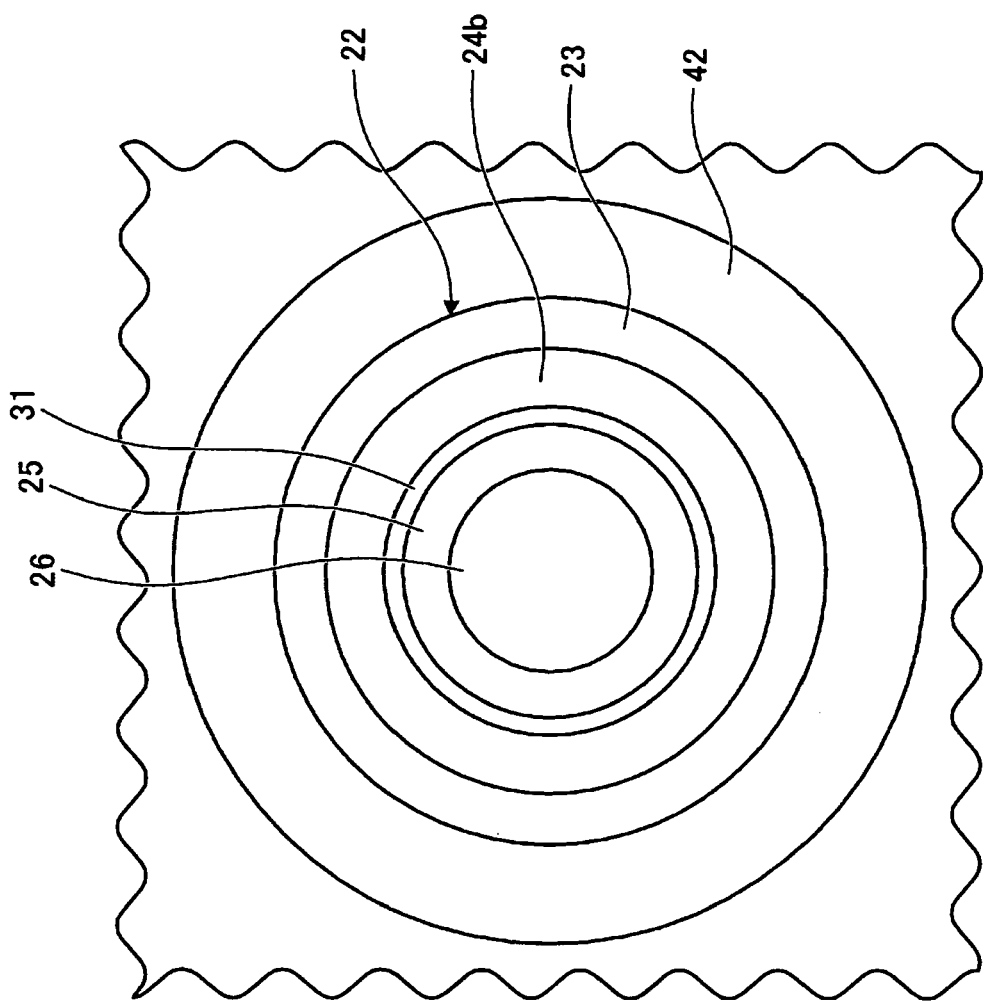
FIG. 8 is a plan view showing an example of the planar layout of the semiconductor device according to Embodiment 5 of the invention.

FIG. 7 is a sectional view showing the configuration of a semiconductor device according to Embodiment 5 of the invention. FIG. 8 is a plan view showing an example of the planar layout of the semiconductor device according to Embodiment 5. As shown in FIG. 7, the semiconductor device 500 is configured in the same manner as the semiconductor device 400 according to Embodiment 4 shown in FIG. 6 except that the hole extraction region 42 of the diverter 41 is formed by another P well provided separately from the first P well 24b. In this case, a high-concentration P$^+$ contact region 43 is provided in a front surface of the P well serving as the hole extraction region 42 and the hole extraction region 42 is set to have the same electric potential as the emitter (source) potential of the primary semiconductor device 21. The first P well 24b may be electrically floating and may be set to have the same electric potential as the emitter (source) potential of the primary semiconductor element 21.

Figure 9:
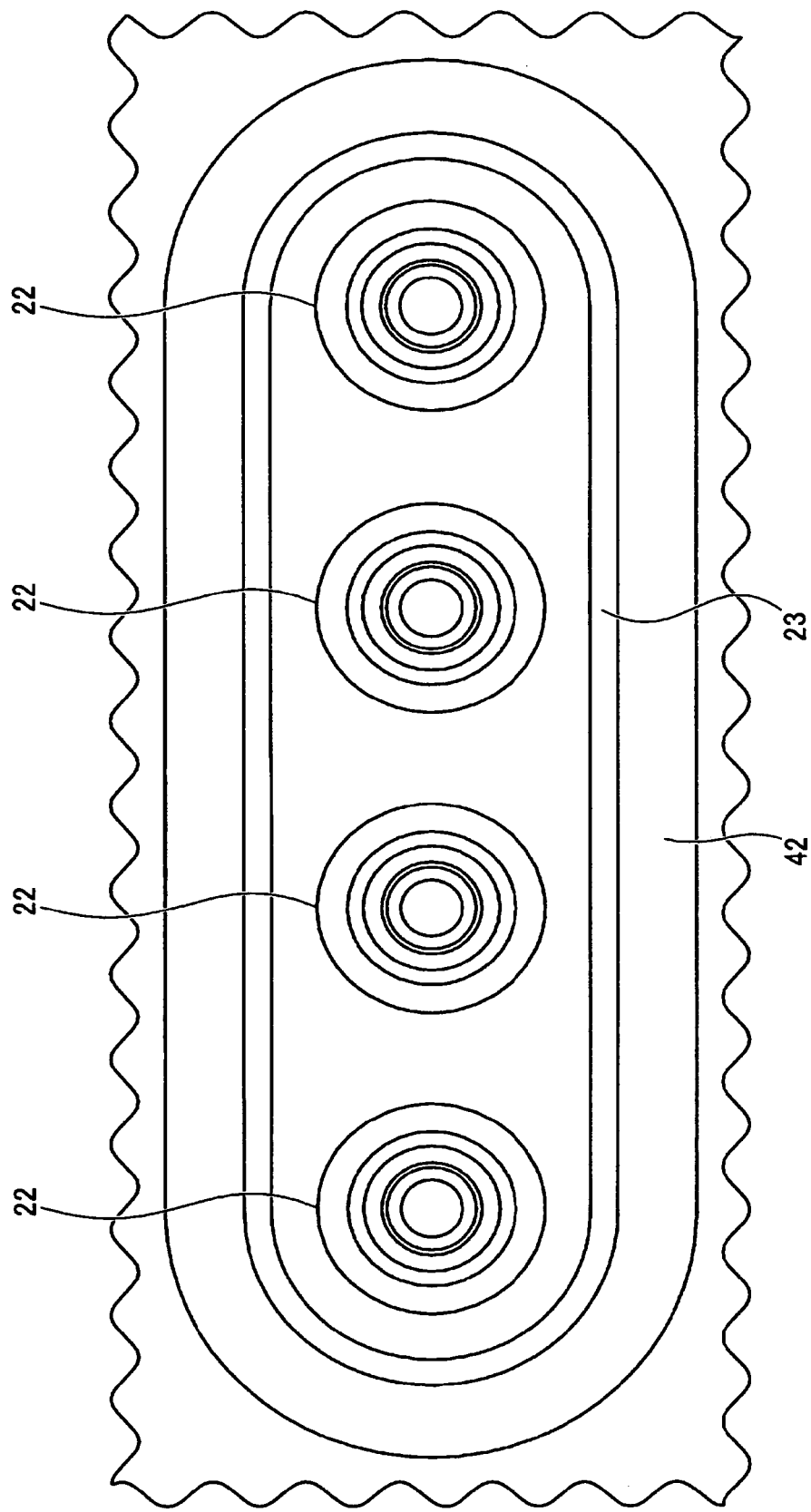
FIG. 9 is a plan view showing another example of the planar layout of the semiconductor device according to Embodiment 5 of the invention.

FIG. 9 is a plan view showing another example of the planar layout of the semiconductor device according to Embodiment 5. The planar layout shown in FIG. 9 is a layout in which a plurality of temperature detecting diodes 22, for example, four temperature detecting diodes 22 are provided though the number of temperature detecting diodes 22 is not particularly limited. As shown in FIG. 9, four temperature detecting diodes 22 are arranged side by side and a hole extraction region 42 of a diverter is provided to surround the four temperature detecting diodes 22.

Embodiment 6

Figure 10:
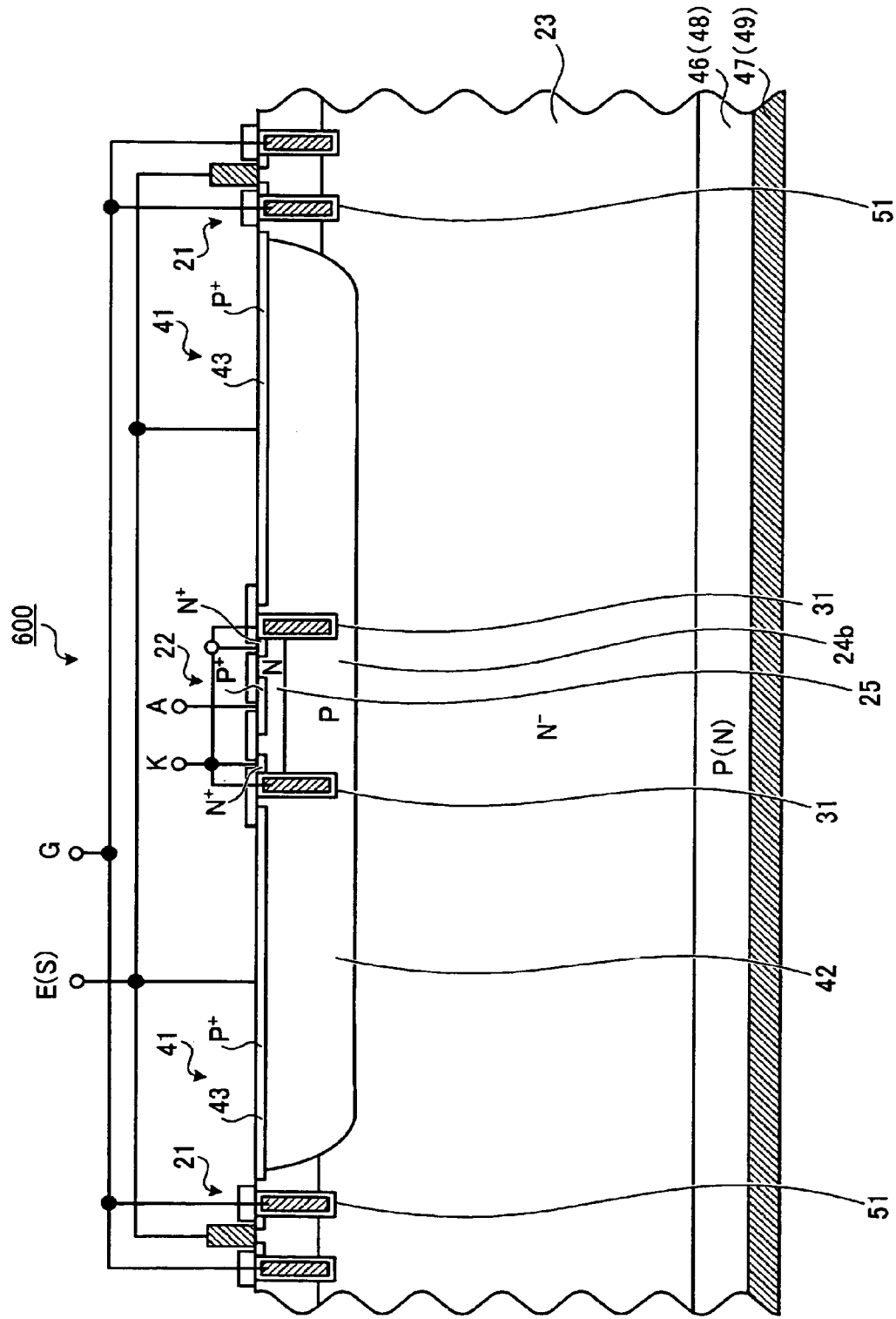
FIG. 10 is a sectional view showing the configuration of a semiconductor device according to Embodiment 6 of the invention.

FIG. 10 is a sectional view showing the configuration of a semiconductor device according to Embodiment 6 of the invention. As shown in FIG. 10, the semiconductor device 600 is configured in the same manner as the semiconductor device 500 according to Embodiment 5 shown in FIG. 7 except that the first P well 24b extends in the transverse direction to form a hole extraction region 42 of a diverter 41 in the same manner as in Embodiment 3. This is equivalent to formation of the first P well 24b and the hole extraction region 42 with one and the same pattern. Incidentally, a primary semiconductor element with a trench gate structure and a temperature detecting diode without any trench gate structure, such as the temperature detecting diode 22 configured as shown in FIG. 3, may be combined in Embodiments 4 to 6.

Embodiment 7

Figure 11:
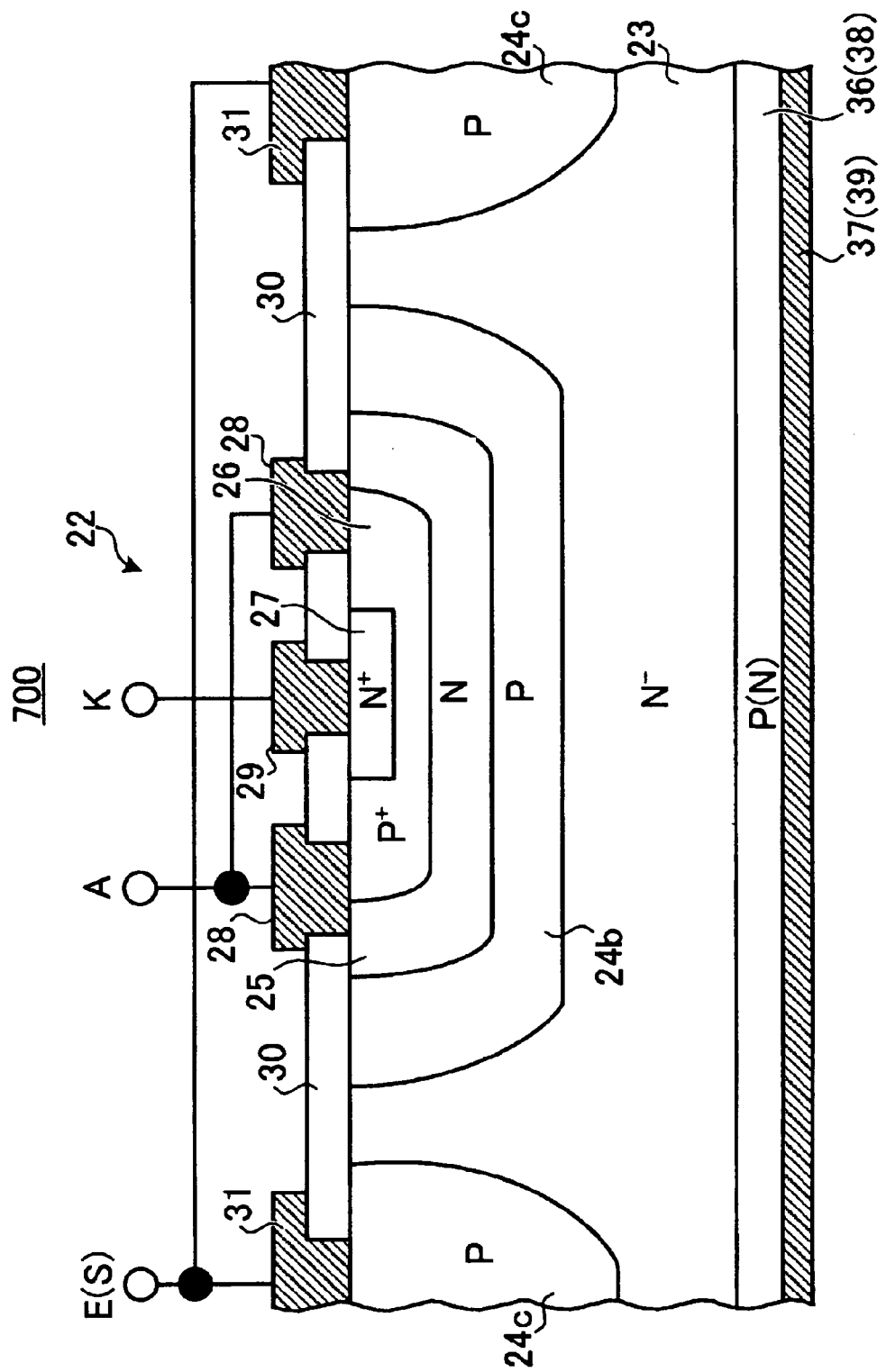
FIG. 11 is a sectional view showing the configuration of a semiconductor device according to Embodiment 7 of the invention.

FIG. 11 is a sectional view showing the configuration of a semiconductor device according to Embodiment 7 of the invention. As shown in FIG. 11, the semiconductor device 100 has a first P well 24b provided as a second semiconductor region in a first principal surface of an N drift layer 23 which is a first semiconductor layer. An N well 25 which is a third semiconductor region is provided in the first P well 24b. A temperature detecting diode (temperature detecting element) 22 is provided in the N well 25.

That is, a high-concentration P$^+$ anode region 26 as a fourth semiconductor region is provided in the N well 25. A high-concentration N$^+$ cathode contact region 27 as a fifth semiconductor region is provided in the P$^+$ anode region 26. An anode electrode (A) 28 is in contact with the P$^+$ anode region 26 and the N well 25. That is, the P$^+$ anode region 26 and the N well 25 are short-circuited by the anode electrode 28. A cathode electrode (K) 29 is in contact with the N$^+$ cathode contact region 27.

The first P well 24b is sufficiently high in concentration to prevent latch-up breakdown due to a parasitic thyristor. In addition, the first P well 24b is sufficiently deep to prevent latch-up breakdown due to the parasitic thyristor. For example, the first P well 24b is covered with an insulating film 30 and is electrically floating. That is, the semiconductor device 100 is further equipped with a primary semiconductor element which is not shown but formed from the N$^-$ drift layer 23. For example, the first P well 24b is not connected to any of the electrodes of the primary semiconductor element. The temperature detecting diode 22 is separated from the not-shown primary semiconductor element by a PN junction between the first P well 24b and the N well 25.

In the first principal surface of the N$^-$ drift layer 23, a second P well 24c is provided outside the first P well 24b so as to be separated from the first P well 24b. For example, the second P well 24c forms a diverter for extracting holes. In this case, for example, a hole extraction electrode 31 is in contact with the second P well 24c. The same electric potential as that of an emitter (source) of the not-shown primary semiconductor element is applied to the second P well 24c through the hole extraction electrode 31.

When the primary semiconductor element is a vertical IGBT, a P collector region 36 and a collector electrode 37 are provided in a second principal surface of the N$^-$ drift layer 23. When the primary semiconductor element is a vertical MOSFET, an N drain region 38 and a drain electrode 39 are provided in the second principal surface of the N$^-$ drift layer 23.

Figure 12:
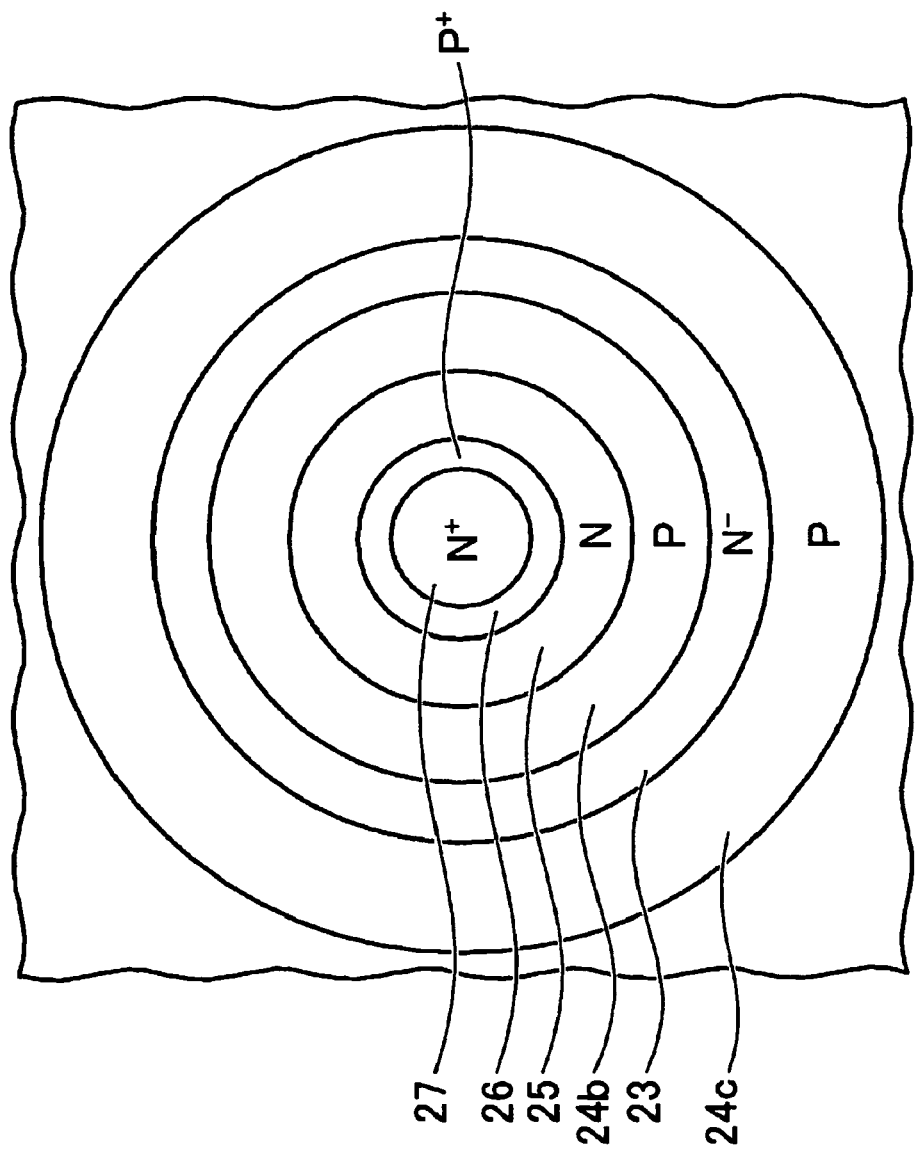
FIG. 12 is a plan view showing an example of the planar layout of the semiconductor device according to Embodiment 7 of the invention.
Figure 13:
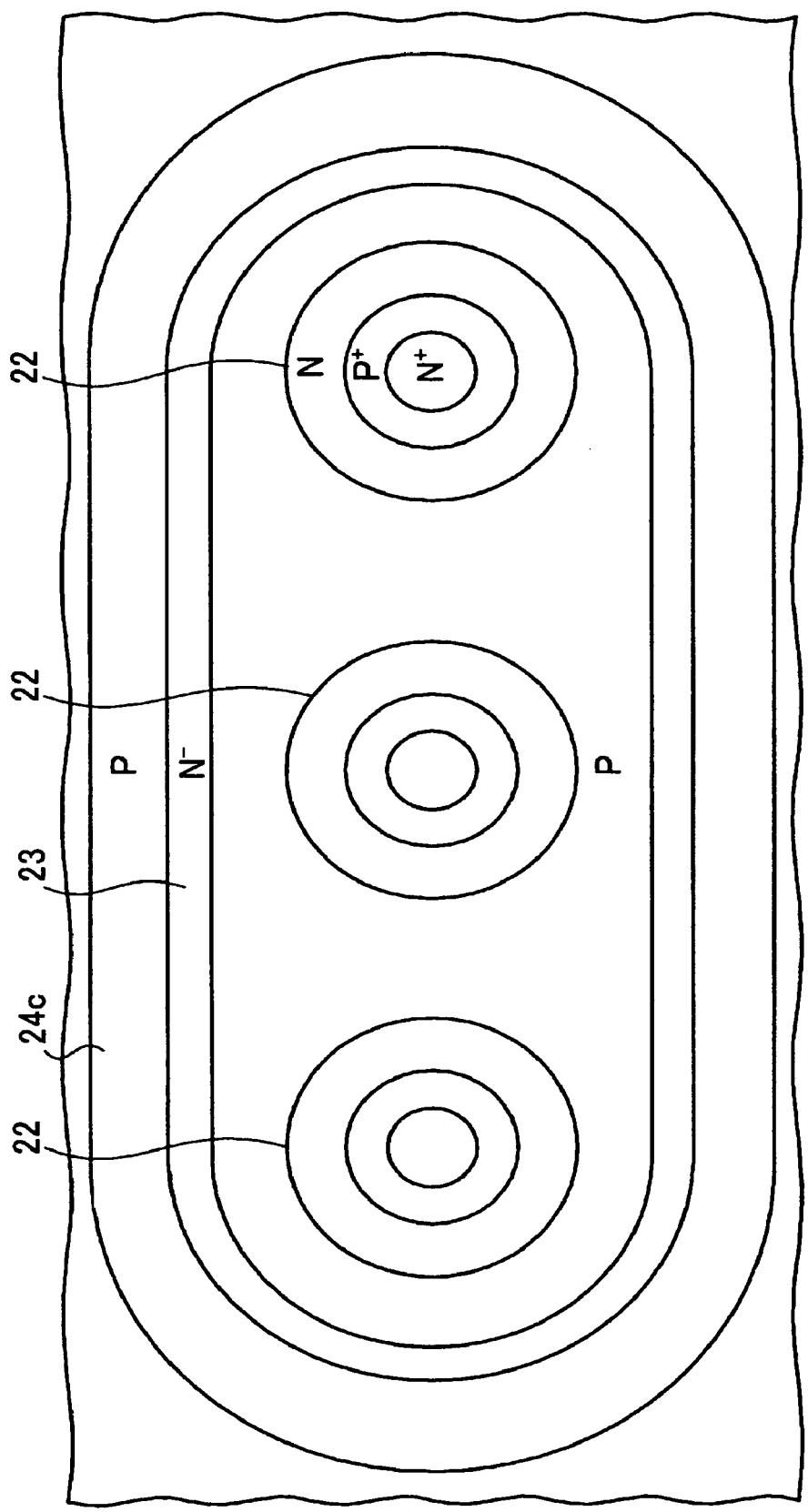
FIG. 13 is a plan view showing another example of the planar layout of the semiconductor device according to Embodiment 7 of the invention.

FIG. 12 is a plan view showing an example of the planar layout of the semiconductor device according to Embodiment 7. As shown in FIG. 12, the planar layout of the semiconductor device 100 is shaped like concentric circles with the N$^+$ cathode region 27 as their center. FIG. 13 shows the planar layout in the case where a plurality of temperature detecting diodes 22, for example, three temperature detecting diodes 22 are provided though the number of temperature detecting diodes 22 is not particularly limited. As shown in FIG. 13, three temperature detecting diodes 22 are arranged side by side and the second P well 24c is provided to surround the three temperature detecting diodes 22.

For production of the semiconductor device 100 shown in FIG. 11, the first P well 24b may be formed at the same time that a P-type field limiting ring or P-type RESURF (reduced surface field) layer of a withstand pressure structure portion of the not-shown primary semiconductor element is formed. In this manner, the production process of the semiconductor device 100 can be simplified because it is not necessary to form the first P well 24b separately from the primary semiconductor element. In addition, the P⁺ anode region 26 may be formed at the same time that a P⁺ body region of the primary semiconductor device is formed. In addition, the N⁺ cathode contact region 27 may be formed at the same time that an N⁺ emitter (source) region of the primary semiconductor element is formed. In this manner, the production process of the semiconductor device 100 can be further simplified because it is not necessary to form the P⁺ anode region 26 and the N⁺ cathode contact region 27 separately from the primary semiconductor element.

In addition, the first P well 24b and the N well 25 may be formed at the same time that the P-type field limiting ring or P-type RESURF layer is formed. When formation of the first P well 24b and the N well 25 and formation of the P⁺ anode region 26 and the N⁺ cathode contact region 27 are used for production of the semiconductor device 100, the temperature detecting diode 22 can be produced in the production process of the primary semiconductor element without addition of any special process. Accordingly, the production process can be simplified remarkably compared with production of the related-art semiconductor device shown in FIG. 2. In this case, it is necessary to select ionic species different in diffusion coefficient for formation of a P-type region and an N-type region. For example, boron can be used as the ionic species for formation of the P-type region, and arsenic can be used as the ionic species for formation of the N-type region.

According to Embodiment 7, even when a channel is formed in the primary semiconductor element and a current flows in the channel, there is no influence on the forward voltage of the temperature detecting diode 22 because the temperature detecting diode 22 is separated from the primary semiconductor element by a junction. That is, it is possible to produce a temperature detecting diode 22 having a constant forward voltage regardless of the state of the primary semiconductor element because the forward voltage of the temperature detecting diode 22 can be prevented from varying according to the state of the primary semiconductor element. In addition, it is possible to produce a semiconductor device 100 equipped with such a temperature detecting diode 22.

Moreover, activation of a parasitic thyristor can be suppressed by the first P well 24b. In addition, activation of the parasitic thyristor can be suppressed by surrounding the temperature detecting diode 22 with the second P well 24c which is the hole extraction region. In addition, activation of the parasitic thyristor can be suppressed by short-circuiting between the N well 25 and the P⁺ anode region 26. Accordingly, it is possible to suppress latch-up breakdown due to the parasitic thyristor so that it is possible to produce a semiconductor device 100 high in latch-up tolerance. In addition, the primary semiconductor element can be operated more stably compared with the configuration in which the temperature detecting diode 22 is simply electrically insulated and separated from the primary semiconductor element. In addition, it is possible to obtain high temperature detection accuracy because variation in the forward voltage is low and the leakage current is small compared with the related-art device equipped with the temperature detecting diode formed from polysilicon on the insulating film. In addition, the response speed of the primary semiconductor element to temperature change is high.

Embodiment 8

Figure 14:
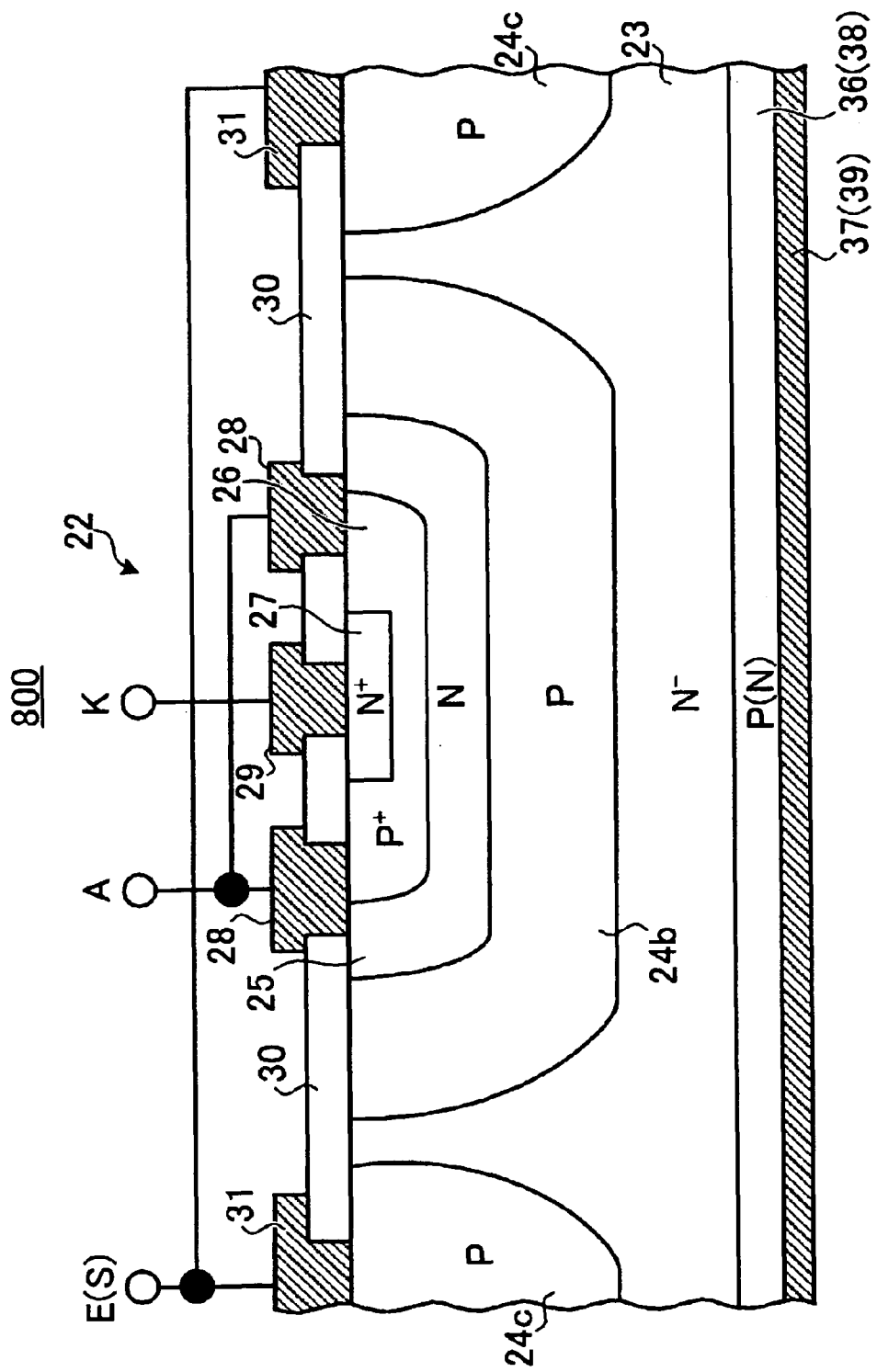
FIG. 14 is a sectional view showing the configuration of a semiconductor device according to Embodiment 8 of the invention.

FIG. 14 is a sectional view showing the configuration of a semiconductor device according to Embodiment 8 of the invention. As shown in FIG. 14, the semiconductor device 200 is configured in the same manner as the semiconductor device 100 according to Embodiment 7 shown in FIG. 11 except that a first P well 24b is formed simultaneously with a P-type channel region of a primary semiconductor element not shown. A second P well 24c is formed simultaneously with the P-type channel region of the primary semiconductor element. Accordingly, the depth of the first P well 24b and the depth of the second P well 24c are not always equal to each other in Embodiment 7. The first P well 24b is however shallower than the second P well 24c in the example shown in FIG. 11, although the depth of the first P well 24b and the depth of the second P well 24c are not particularly limited. On the other hand, the first P well 24b is equal in depth to the second P well 24c in Embodiment 8 shown in FIG. 14. The remaining configuration is the same as in Embodiment 7.

Embodiment 9

Figure 15:
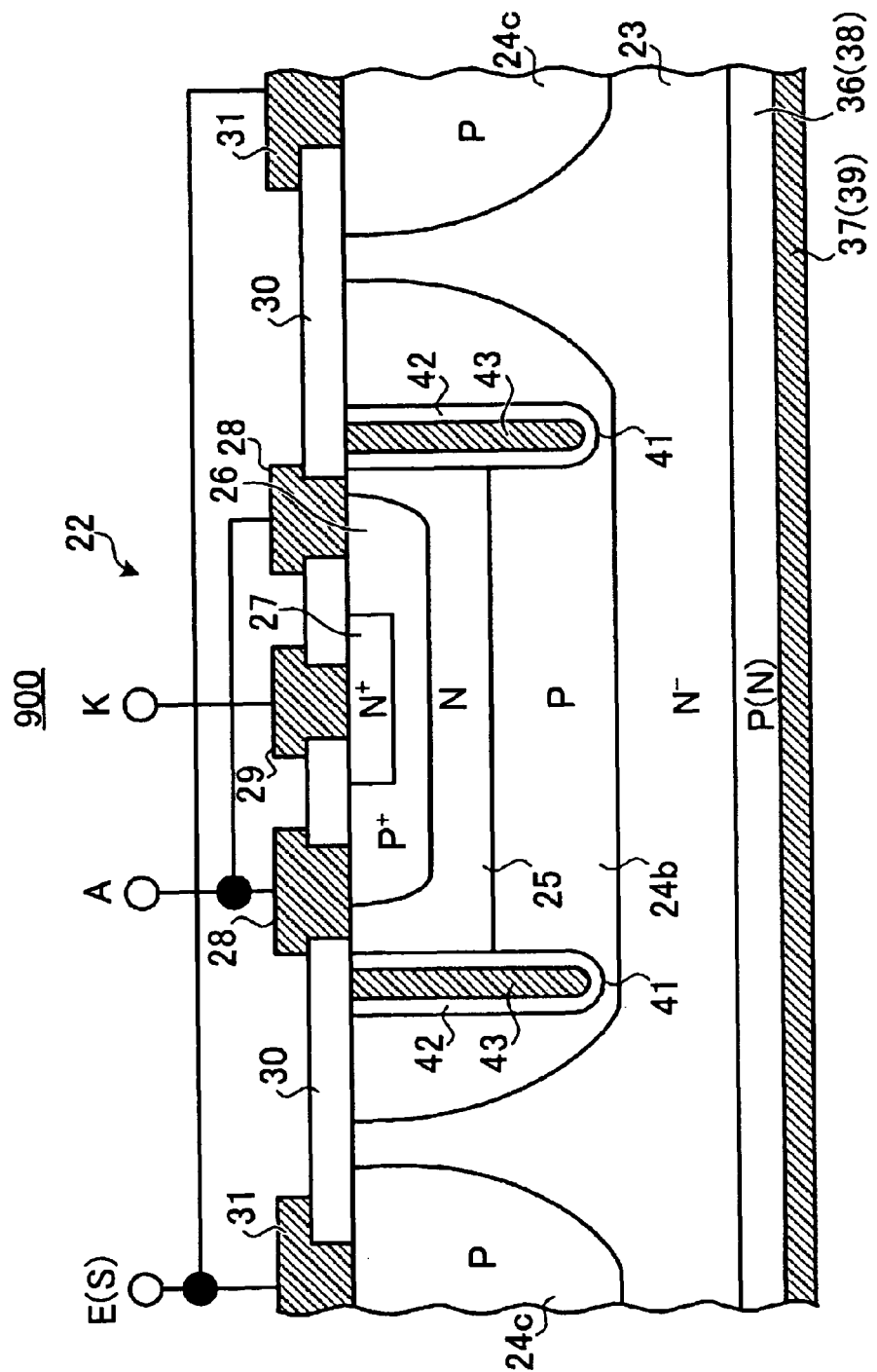
FIG. 15 is a sectional view showing the configuration of a semiconductor device according to Embodiment 9 of the invention.
Figure 16:
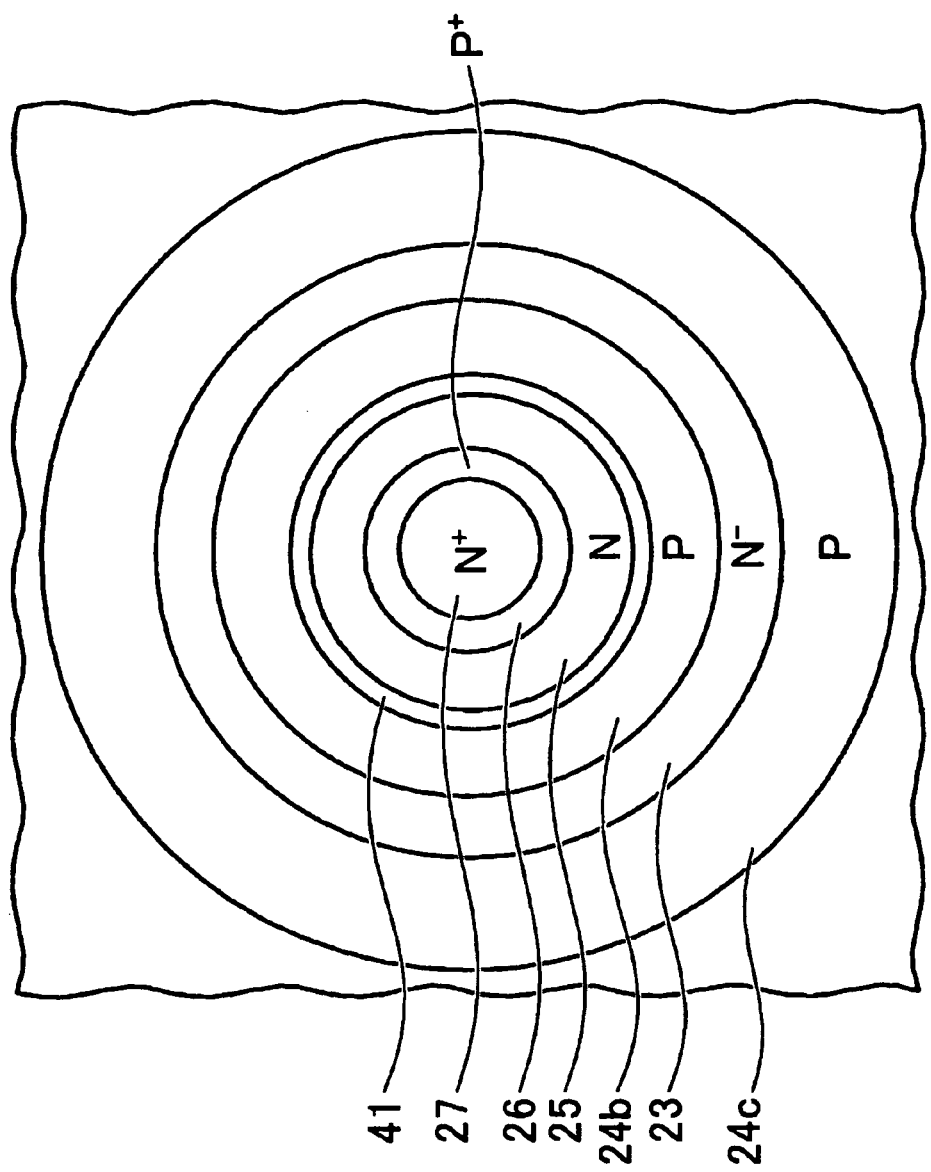
FIG. 16 is a plan view showing an example of the planar layout of the semiconductor device according to Embodiment 9 of the invention.

FIG. 15 is a sectional view showing the configuration of a semiconductor device according to Embodiment 9 of the invention. FIG. 16 is a plan view showing an example of the planar layout of the semiconductor device according to Embodiment 9. As shown in FIGS. 5 and 6, the semiconductor device 300 is formed in the same manner as the semiconductor device 100 according to Embodiment 7 shown in FIG. 11 except that a side of an N well 25 is surrounded by a trench gate structure 41. In addition, occurrence of latchup in a transverse direction can be suppressed because activation of an NPN transistor formed in the transverse direction can be suppressed by the trench gate structure 41.

The trench gate structure 41 is provided in a terminal portion of the N well 25 in the first P well 24b. The trench gate structure 41 extends to be deeper than the N well 25. An insulating film 42 such as an oxide film is provided in a portion being in contact with a semiconductor of the trench gate structure 41, i.e. in an inner circumferential surface of the trench. The inside of the insulating film 42 is filled with a conductor such as polysilicon 43. It is preferable that the electrode of this polysilicon 43 is set to have the same electric potential as that of the cathode. When, for example, the gate structure of the primary semiconductor element is a trench gate structure, the trench gate structure 41 may be formed at the same time that the trench gate structure of the primary semiconductor element is formed. The remaining configuration is the same as in Embodiment 7.

Embodiment 10

Figure 17:
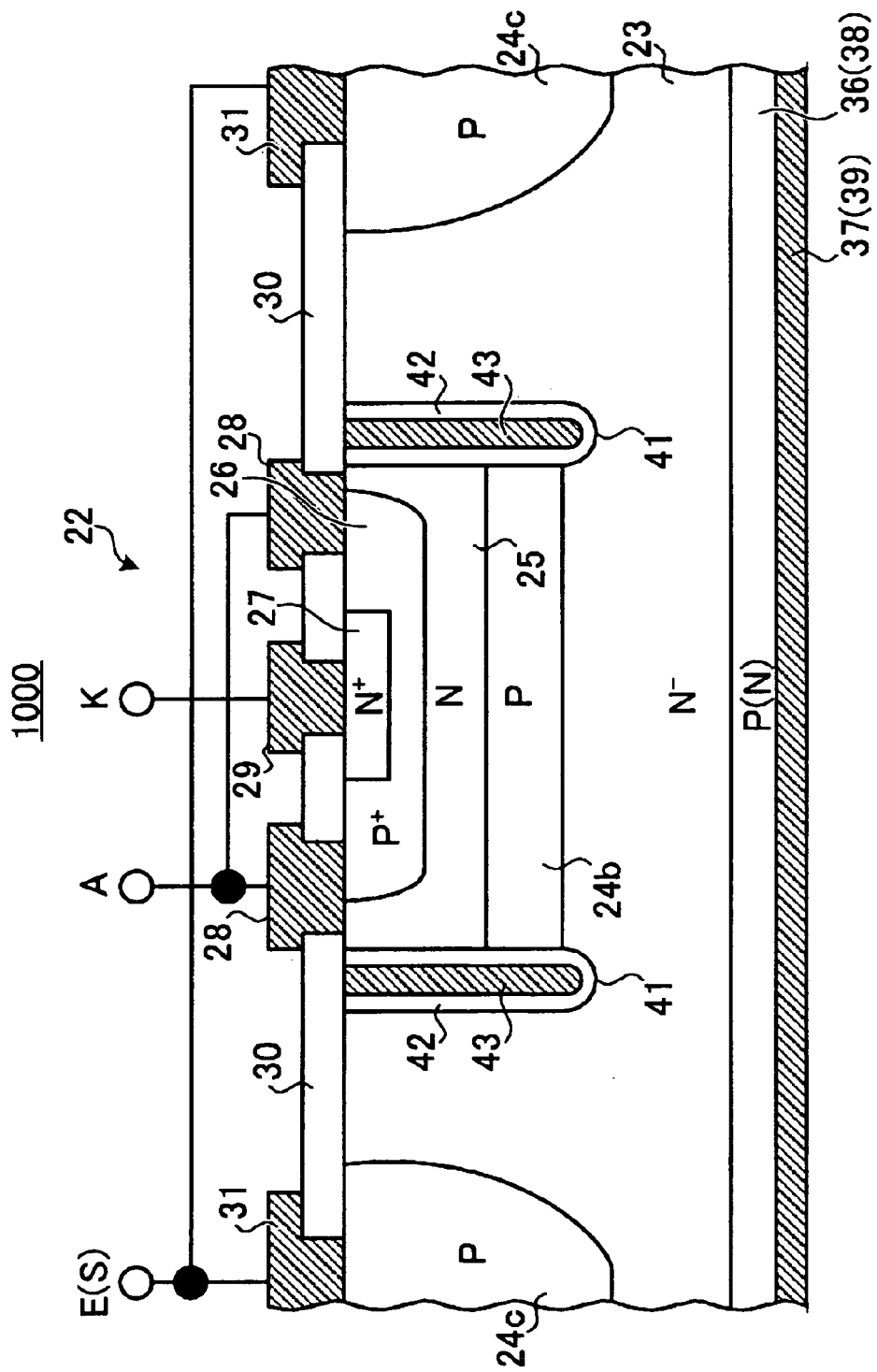
FIG. 17 is a sectional view showing the configuration of a semiconductor device according to Embodiment 10 of the invention.

FIG. 17 is a sectional view showing the configuration of a semiconductor device according to Embodiment 10 of the invention. As shown in FIG. 17, the semiconductor device 400 is formed in the same manner as the semiconductor device 100 according to Embodiment 7 shown in FIG. 11 except that a side of a first P well 24b is surrounded by a trench gate structure 41. In addition, occurrence of latchup in a transverse direction can be suppressed because activation of an NPN transistor formed in the transverse direction can be suppressed completely by the trench gate structure 41. The trench gate structure 41 is the same as that in Embodiment 9. The remaining configuration is the same as in Embodiment 7.

Embodiment 11

Figure 18:
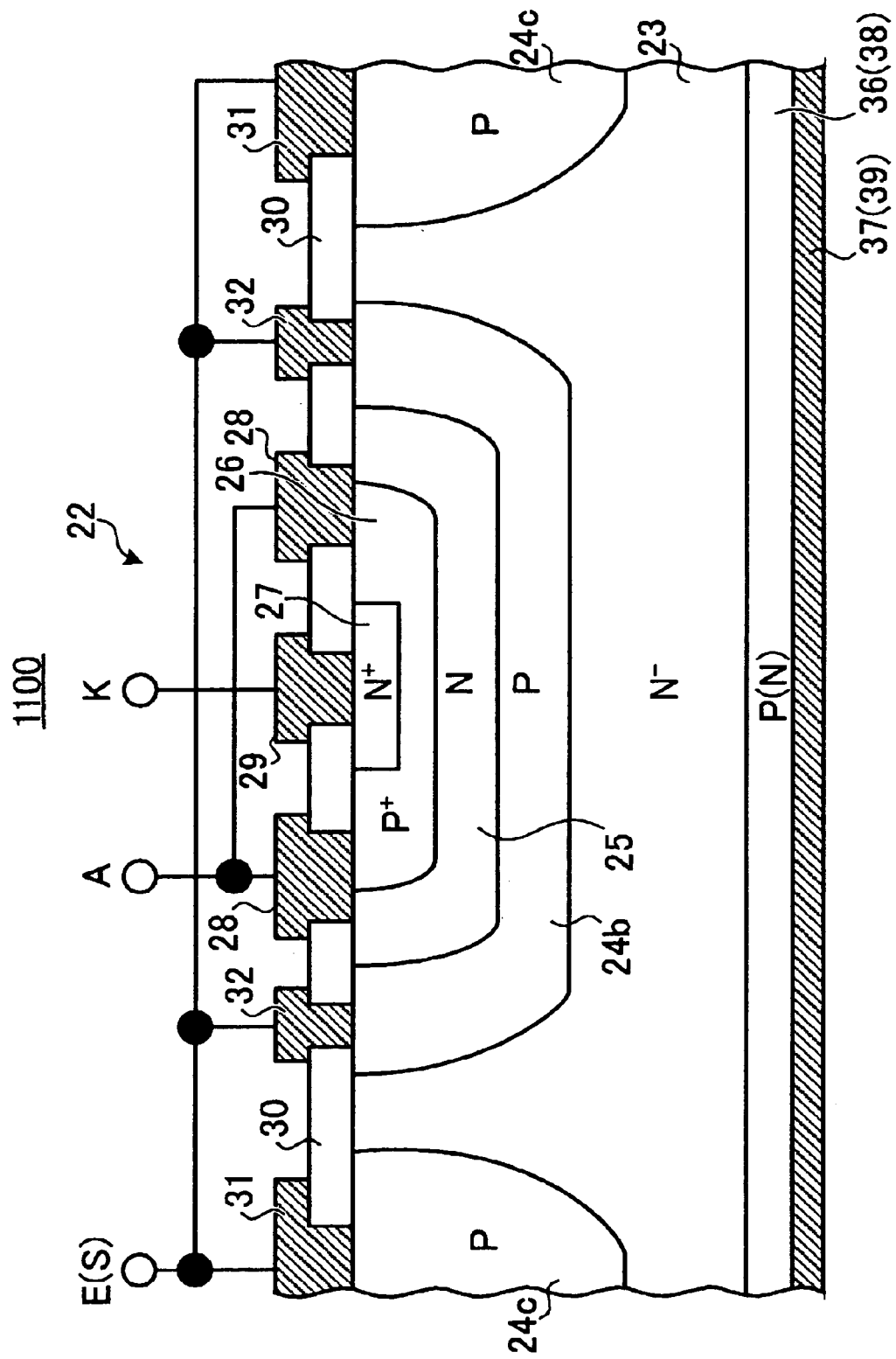
FIG. 18 is a sectional view showing the configuration of a semiconductor device according to Embodiment 11 of the invention.

FIG. 18 is a sectional view showing the configuration of a semiconductor device according to Embodiment 11 of the invention. As shown in FIG. 18, the semiconductor device 500 is formed in the same manner as the semiconductor device 100 according to Embodiment 7 shown in FIG. 11 except that an electrode 32 is in contact with the first P well 24b and the same electric potential as that of the emitter (source) potential of the primary semiconductor element not shown is applied to the first P well 24b through the electrode 32. That is, the first P well 24b is electrically connected to the emitter (source) electrode which is a ground electrode of the primary semiconductor element. In this manner, occurrence of latchup due to high dV/dt can be suppressed because voltage change (dV/dt) at the time of switching becomes gentle. The remaining configuration is the same as in Embodiment 7. Incidentally, the first P well 24b may be connected to the ground electrode of the primary semiconductor element also in the respective configurations of Embodiments 8 to 10.

Embodiment 12

Figure 19:
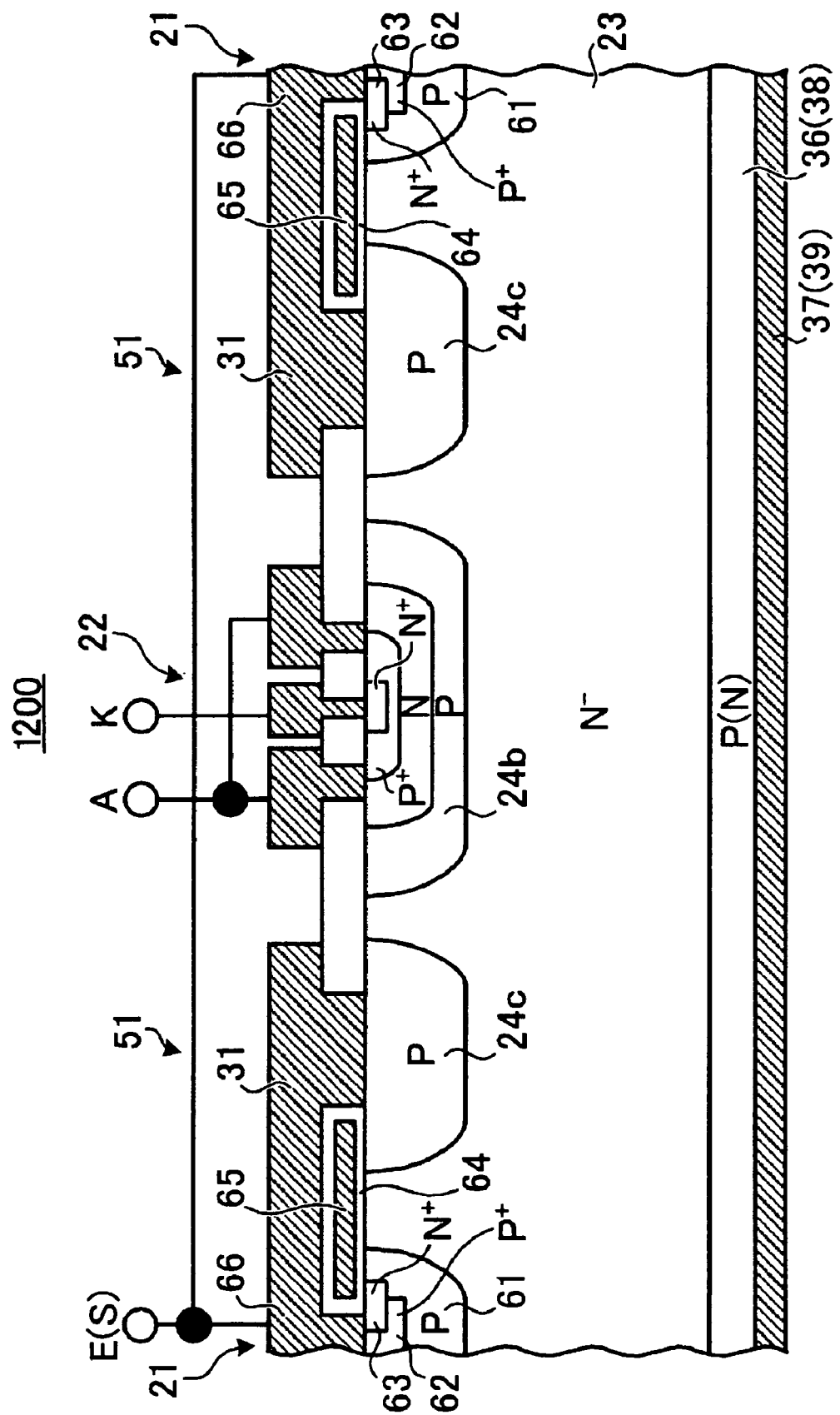
FIG. 19 is a sectional view showing the configuration of a semiconductor device according to Embodiment 12 of the invention.

FIG. 19 is a sectional view showing the configuration of a semiconductor device according to Embodiment 12 of the invention. As shown in FIG. 19, the semiconductor device 600 is a device including the temperature detecting diode 22 configured as shown in FIG. 11 and its peripheral structure. A second P well 24c forms a hole extraction region of a diverter 51. A primary semiconductor element 21 includes a P channel region 61, a P+ body region 62, an N+ emitter (source) region 63, a gate insulating film 64, a gate electrode 65 and an emitter (source) electrode 66. In the example shown in FIG. 19, a hole extraction electrode 31 is integrated with the emitter (source) electrode 66 and formed by one and the same pattern as that of the emitter (source) electrode 66.

Figure 20:
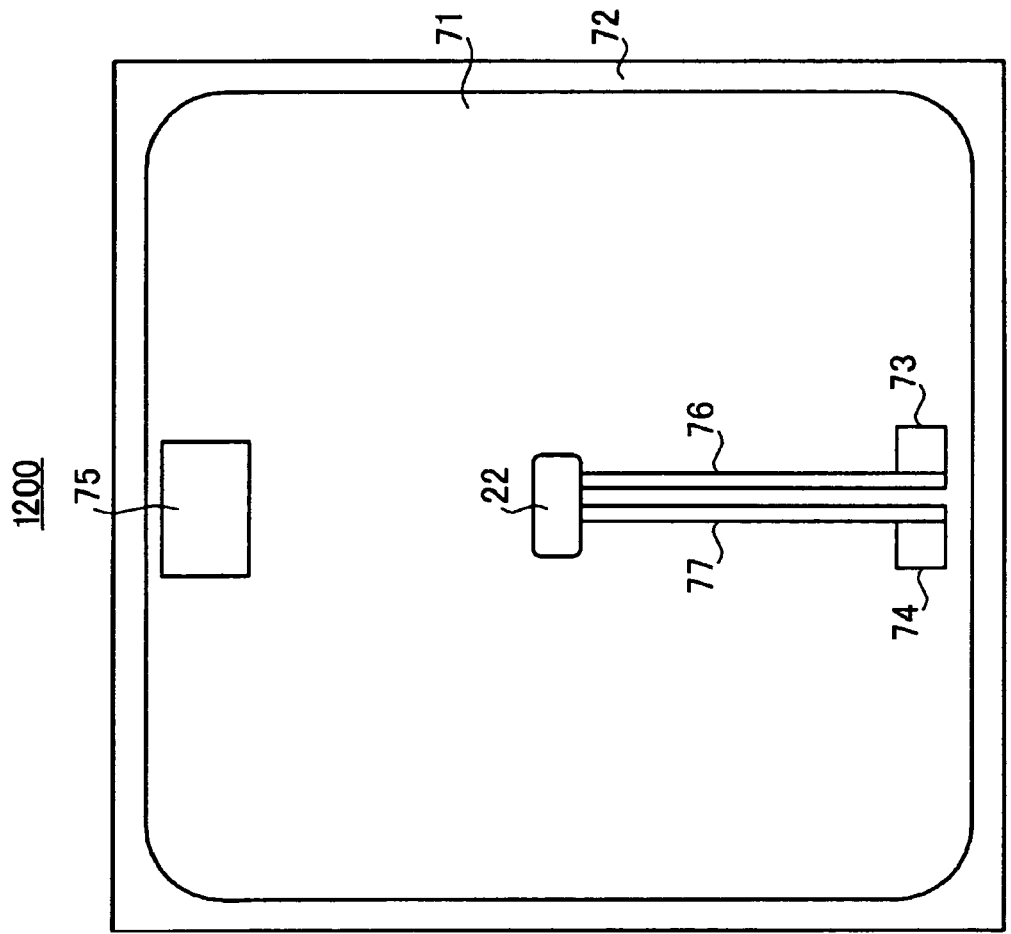
FIG. 20 is a plan view showing an example of the planar layout of the semiconductor device according to Embodiment 12 of the invention.

FIG. 20 is a plan view showing an example of the planar layout of the whole semiconductor device. As shown in FIG. 20, an active region 71 of a primary semiconductor element is surrounded by a withstand pressure structure portion 72. A temperature detecting diode 22 is provided in the active region 71. An anode pad 73, a cathode pad 74 and a gate pad 75 are provided on the active region 71. The anode pad 73 and the cathode pad 74 are connected to the temperature detecting diode 22 by an anode wiring 76 and a cathode wiring 77, respectively. The P-type field limiting ring or P-type RESURF layer described in Embodiment 7 is provided in the withstand pressure structure portion 72. Incidentally, the configurations of respective parts provided in the active region 71 of the primary semiconductor element are omitted in FIG. 20 in order to avoid complication of the drawing.

In the above description, the invention is not limited to the aforementioned embodiments but can be changed variously. For example, the gate structure of the primary semiconductor element may be a trench gate structure. In addition, although the respective embodiments have been described on the case where the first conductivity type is an N type and the second conductivity type is a P type, the invention can be also realized when the first conductivity type is a P type and the second conductivity type is an N type.

As described above, the semiconductor device according to the invention is useful for a semiconductor device equipped with a temperature detecting element for overheat protection use and particularly suitable for a power semiconductor device such as an IGBT or an MOSFET.

What is claimed is:
1. A vertical semiconductor device, comprising:
 a first semiconductor layer of a first conductivity type, which forms a primary semiconductor element, the first semiconductor layer having a first surface and a second surface opposite to the first surface;
 a first semiconductor region of a second conductivity type provided in the first surface of the first semiconductor layer;
 a second semiconductor region of the first conductivity type provided in the first semiconductor region;
 a temperature detecting element for detecting a temperature of the primary semiconductor element, the temperature detecting element being provided in the second semiconductor region and being separated from the first semiconductor layer by a PN junction,
 a second semiconductor layer of the second conductivity type, formed on the second surface of the first semiconductor layer and being in touch with the second surface; and
 an electrode formed on the second semiconductor layer.

2. The vertical semiconductor device of claim 1, further comprising a third semiconductor region of the second conductivity type provided in the second semiconductor region, wherein the temperature detecting element includes a diode formed with the second semiconductor region as one of a cathode and an anode, and the third semiconductor region as the other of the cathode and the anode.

3. The vertical semiconductor device of claim 2, wherein the anode and the cathode are surrounded by a hole-extraction region.

4. The vertical semiconductor device of claim 2, wherein the first semiconductor region is an electrically floating region.

5. The vertical semiconductor device of claim 4, wherein the anode and the cathode are surrounded by a hole-extraction region.

6. The vertical semiconductor device of claim 2, further comprising a fourth semiconductor region of the second conductivity type which surrounds a side of the second semiconductor region and which has a dopant concentration higher than a dopant concentration of the first semiconductor region.

7. The vertical semiconductor device of claim 6, wherein the anode and the cathode are surrounded by a hole-extraction region.

8. The semiconductor device of claim 2, wherein the primary semiconductor element includes an emitter and a source, the first semiconductor region and one of the emitter and the source having a same electric potential.

9. The semiconductor device of claim 8, wherein the anode and the cathode are surrounded by a hole-extraction region.

10. The semiconductor device of claim 2, wherein the second semiconductor region has a depth relative to an upper surface of the device, the semiconductor device having a trench surrounding the second semiconductor region, the trench having a depth greater than the depth of the second semiconductor region.

11. The semiconductor device of claim 10, wherein the anode and the cathode are surrounded by a hole-extraction region.

12. The semiconductor device of claim 10, further comprising a conductor embedded in the trench and an insulating film surrounding the conductor such that the conductor and the cathode have a same electric potential.

13. The semiconductor device of claim 12, wherein the anode and the cathode are surrounded by a hole-extraction region.

14. The semiconductor device of claim 1, further comprising:
 a third semiconductor region of the second conductivity type provided in the second semiconductor region; and
 a fourth semiconductor region of the first conductivity type provided in the third semiconductor region; wherein the second semiconductor region and the third semiconductor region are electrically connected, and the temperature detecting element includes a diode formed with the third semiconductor region as one of an anode and a cathode, and the fourth semiconductor region as the other of the anode and the cathode.

15. The semiconductor device of claim 14, further including a trench surrounding the first semiconductor region.

16. The semiconductor device of claim 14, wherein the primary semiconductor element includes an electrode electrically insulated from the first semiconductor region.

17. The semiconductor device of claim 16, including a trench surrounding the first semiconductor region.

18. The semiconductor device of claim 14, wherein the primary semiconductor element includes a ground electrode connected to the first semiconductor region.

19. The semiconductor device of claim 18, including a trench surrounding the first semiconductor region.

20. The vertical semiconductor device of claim 1, wherein the vertical semiconductor device is an IGBT (Insulated Gate Bipolar Transistor), and the second semiconductor layer is a P collector region.

* * * * *